United States Patent
Sayama et al.

(10) Patent No.: US 6,506,651 B2
(45) Date of Patent: Jan. 14, 2003

(54) SEMICONDUCTOR DEVICE AND MANUFACTURING METHOD THEREOF

(75) Inventors: Hirokazu Sayama, Tokyo (JP); Hidekazu Oda, Tokyo (JP); Yukio Nishida, Tokyo (JP); Toshiyuki Oishi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/986,581

(22) Filed: Nov. 9, 2001

(65) Prior Publication Data

US 2002/0047163 A1 Apr. 25, 2002

Related U.S. Application Data

(62) Division of application No. 09/494,360, filed on Jan. 31, 2000.

(30) Foreign Application Priority Data

Jul. 26, 1999 (JP) .......................... 11-210208

(51) Int. Cl.$^7$ ...................... H01L 21/336; H01L 21/44; H01L 21/469; H01C 21/31
(52) U.S. Cl. ...................... 438/301; 438/655; 438/682; 438/769
(58) Field of Search .................. 438/301, 766, 438/664, 655, 682, 592, 305, 586

(56) References Cited

U.S. PATENT DOCUMENTS

| | | | |
|---|---|---|---|
| 5,177,568 A | | 1/1993 | Honma et al. |
| 5,366,928 A | * | 11/1994 | Wolters et al. ......... 148/DIG. 1 |
| 5,397,909 A | * | 3/1995 | Moslehi ....................... 257/383 |
| 5,818,092 A | * | 10/1998 | Bai et al. ..................... 257/369 |
| 5,861,340 A | * | 1/1999 | Bai et al. ..................... 438/592 |
| 6,015,753 A | * | 1/2000 | Lin et al. ..................... 438/682 |
| 6,133,124 A | * | 10/2000 | Horstmann et al. ......... 438/525 |
| 6,147,402 A | | 11/2000 | Joshi et al. |
| 6,171,919 B1 | * | 1/2001 | Besser et al. ................ 438/305 |
| 6,204,136 B1 | * | 3/2001 | Chan et al. .................. 438/305 |
| 6,255,703 B1 | * | 7/2001 | Hause et al. ................. 257/382 |
| 6,274,511 B1 | * | 8/2001 | Wieczorek et al. .......... 438/592 |

FOREIGN PATENT DOCUMENTS

| | | |
|---|---|---|
| JP | 63-12168 | 1/1988 |
| JP | 63-292679 | 11/1988 |
| JP | 11-17178 | 1/1999 |

* cited by examiner

Primary Examiner—John F. Niebling
Assistant Examiner—Walter Lindsay
(74) Attorney, Agent, or Firm—McDermott, Will & Emery

(57) ABSTRACT

There are provide a semiconductor device capable of increasing the operating speed of MOS transistors and improving current driving capability, and a method of manufacturing such a semiconductor device. A semiconductor device comprises a silicon substrate (1), an element isolation insulation film (2), a gate structure selectively formed on the main surface of the silicon substrate (1), and a sidewall (6) formed on the side face of the gate structure. The gate structure has a laminated structure with a gate insulation film (3) formed of a silicon oxide film, a gate electrode (4) formed of polysilicon, and a cobalt silicide layer (5) stacked in this order. The semiconductor device further comprises a source/drain region (7) selectively formed in the main surface of the silicon substrate (1) and a cobalt silicide layer (8) formed in the main surface of the silicon substrate (1), extending to a point under an end portion of the gate structure from a portion of the source/drain region (7) exposed from the sidewall 6 and the gate structure.

15 Claims, 20 Drawing Sheets

SEMICONDUCTOR DEVICE AND MANUFACTURING METHOD THEREOF

This application is a Divisional of application Ser. No. 09/494,360 filed Jan, 31, 2000.

BACKGROUND OF THE INVENTION

1. Field of the Invention

The present invention relates to a semiconductor device and a manufacturing method thereof.

2. Description of the Background Art

With the recent trend toward low-voltage, down-sized semiconductor devices, reduction in source/drain resistance becomes important to increase the operating speed of MOS transistors and to improve current driving capability.

FIGS. 37 through 40 are cross-sectional views illustrating a method of manufacturing a conventional semiconductor device in order of successive steps. An element isolation insulation film 102 formed of a silicon oxide film is first formed in an element isolation region of a silicon substrate 101 and a silicon oxide film 103 is formed on the main surface of the silicon substrate 101 in an element forming region. A polysilicon film 104 is then formed over the entire surface (FIG. 37). The polysilicon film 104 is patterned by photolithographic techniques to form a gate electrode 105 (FIG. 38).

The silicon oxide film 103 except that under the gate electrode 105 is removed to form a gate insulation film 106, and sidewalls 107 formed of silicon oxide films are formed on the side faces of the gate insulation film 106 and of the gate electrode 105. The exposed main surface of the silicon substrate 101 is doped with impurities by ion implantation. Following this, heat treatment is carried out to form source/drain regions 108 (FIG. 39).

After a cobalt film is formed across the surface by a sputtering method, cobalt silicide layers 109 and 110 are formed by heat treatment in the upper surfaces of the source/drain regions 108 and of the gate electrode 105, respectively. The unreacted cobalt film is then removed (FIG. 40). This will reduce the source/drain and gate resistances, thus increasing the operating speed of MOS transistors and improving current driving capability.

In this method of manufacturing a conventional semiconductor device, however, the cobalt silicide layers 109 are formed only in the upper surfaces of the source/drain regions 108 exposed from the sidewalls 107 and the gate electrode 105, so there is a problem that the effect of reducing the source/drain resistance may not be sufficient.

SUMMARY OF THE INVENTION

A first aspect of the present invention is directed to a semiconductor device comprising: a substrate; a gate structure selectively formed on a main surface of the substrate, having a laminated structure with a gate insulation film and a gate electrode stacked in this order; a sidewall formed on a side face of the gate structure; a source/drain region selectively formed in the main surface of the substrate, having an impurity concentration of over $1\times10^{19}/cm^3$ under the sidewall; and a metal-semiconductor compound region formed in the main surface of the substrate, extending to a point at least under the sidewall from a portion of the source/drain region exposed from the gate structure.

According to a second aspect of the present invention, in the semiconductor device of the first aspect, an end portion of the metal-semiconductor compound region on the gate structure's side is located under an end portion of the gate structure.

According to a third aspect of the present invention, in the semiconductor device of the first aspect, an end portion of the metal-semiconductor compound region on the gate structure's side is located under the sidewall.

According to a fourth aspect of the present invention, in the semiconductor device of either of the first through third aspects, an end portion of the metal-semiconductor compound region on the gate structure's side is located within the source/drain region.

A fifth aspect of the present invention is directed to a method of manufacturing a semiconductor device, comprising the steps of: (a) selectively forming a gate structure on a main surface of a substrate, the gate structure having a laminated structure with a gate insulation film and a gate electrode stacked in this order; (b) forming an amorphous region in a portion of the main surface of the substrate where a metal-semiconductor compound region is to be formed; and (c) forming the metal-semiconductor compound region by silicidation of the amorphous region.

According to a sixth aspect of the present invention, in the step (b) of the method of the fifth aspect, the amorphous region is formed by implanting heavy ions into the substrate with the gate structure as a mask.

According to a seventh aspect of the present invention, in the method of the fifth aspect, the step (b) comprises the steps of: (b-1) forming a sidewall on a side face of the gate structure; and (b-2) implanting heavy ions into the substrate with the gate structure and the sidewall as masks.

According to an eighth aspect of the present invention, in the step (b) of the method of either the sixth or seventh aspect, the heavy ions are angularity implanted into the substrate with respect to a normal to the main surface of the substrate.

According to a ninth aspect of the present invention, the method of the fifth aspect further comprises the steps of: (d) forming a sidewall on a side face of the gate structure; (e) doping the substrate with impurities using the gate structure and the sidewall as masks; and (f) forming a source/drain region in the main surface of the substrate by thermal diffusion of the impurities in the substrate, wherein, in the step (b), the amorphous region is simultaneously formed by doping with the impurities in the step (e), wherein the step (c) is performed between the step (e) and the step (f).

According to a tenth aspect of the present invention, in the step (b) of the method of the fifth aspect, the amorphous region is formed by forming a sidewall on a aside face of the gate structure, the sidewall being made of a material that produces, with the substrate, such high stress that the substrate becomes amorphous.

An eleventh aspect of the present invention is directed to a method of manufacturing a semiconductor device, comprising the steps of: (a) selectively forming a gate structure on a main surface of a substrate, the gate structure having a laminated structure with a gate insulation film and a gate electrode stacked in this order; (b) forming a sidewall on a side face of the gate structure; (c) forming a depression by digging in a portion of the main surface of the substrate where the gate structure and the sidewall are not formed; and (d) forming a metal-semiconductor compound region by silicidation of the substrate from a surface of the depression.

According to a twelfth aspect of the present invention, in the step (c) of the method of the eleventh aspect, the depression is formed by isotropic etching of the substrate.

According to a thirteenth aspect of the present invention, in the method of the eleventh aspect, the step (b) comprises the steps of: (b-1) forming an insulation film on a structure obtained by the step (a); and (b-2) etching the insulation film by a high etch rate of anisotropic etching in a depth direction of the substrate, wherein, in the step (c), the depression is formed by the anisotropic etching.

According to a fourteenth aspect of the present invention, in the method of the eleventh aspect, the step (d) comprises the steps of: (d-1) forming a metal film on a surface of the depression by sputtering of a metallic material; and (d-2) inducing a reaction between the metal film and the substrate by heat treatment to form the metal-semiconductor compound region, wherein, in the step (d-1), the metallic material is angularity sputtered on the surface of the depression with respect to a normal to the main surface of the substrate.

According to a fifteenth aspect of the present invention, the method of the eleventh aspect further comprises: (e) digging in an upper surface of the gate electrode to a predetermined depth; and (f) after the step (e), forming a metal-semiconductor compound layer by silicidation of a resultant upper surface of the gate electrode.

According to a sixteenth aspect of the present invention, in the method of the eleventh aspect, the gate structure formed in the step (a) has a laminated structure with the insulation film, the gate electrode, and a mask insulation film stacked in this order. The method further comprises the steps of: (e) after the step (b), removing the mask insulation film; and (1) forming a metal-semiconductor compound layer by silicidation of an upper surface of the gate electrode exposed by the removal of the mask insulation film.

According to a seventeenth aspect of the present invention, the method of either of the fifth through sixteenth aspects further comprises the step of: (g) after the step (a), forming a source/drain region in the main surface of the substrate by doping the substrate with impurities using the gate structure as a mask, wherein an end portion of the metal-semiconductor compound region on the gate structure's side is located within the source/drain region.

In the semiconductor device of the first aspect, the metal-semiconductor compound region having the effect of reducing the source/drain resistance is formed, extending to a point at least under the sidewall from a portion of the source/drain region exposed from the gate structure. The device thus has reduced sheet resistance in the source/drain region and improved propagation delay velocity, resulting in higher operating speed, and further has reduced source/drain resistance, resulting in improved current driving capability.

In the semiconductor device of the second aspect, the metal-semiconductor compound region having the effect of reducing the source/drain resistance is formed, extending to a point under the end portion of the gate structure from a portion of the source/drain region exposed from the gate structure. This enhances the effect of reducing the source/drain resistance, thus achieving higher operating speed and improved current driving capability.

In the semiconductor device of the third aspect, the nonexistence of the metal-semiconductor compound region under the gate structure prevents a short circuit through the gate insulation film in the gate electrode and in the metal-semiconductor compound region.

In the semiconductor device of the fourth aspect, the metal-semiconductor compound region is formed within the source/drain region. This suppresses leakage current flowing from the metal-semiconductor compound region to the substrate.

In the method of the fifth aspect, since silicidation is more likely to proceed in an amorphous region than in a single crystalline substrate, the metal-semiconductor compound region can appropriately be formed by silicidation of the amorphous region which was previously formed in a portion where the metal-semiconductor compound region is to be formed.

In the method of the sixth aspect, lateral scattering of heavy ions in the substrate causes an amorphous region to be formed even under the end portion of the gate structure. This allows the metal-semiconductor compound region to extend to a point under the end portion of the gate structure.

In the method of the seventh aspect, lateral scattering of heavy ions in the substrate causes an amorphous region to be formed even under the sidewall. This allows the metal-semiconductor compound region to extend to a point under the sidewall.

In the method of the eighth aspect, in order to form an amorphous region, heavy ions are angularity implanted into the substrate with respect to the normal to the main surface of the substrate. This increases the amount of extension of the amorphous region to a point under the gate structure or under the sidewall, as compared with the case where heavy ions are implanted almost in parallel to the normal to the main surface of the substrate.

In the method of the ninth aspect, by utilizing the fact that the amorphous region is formed together with the source/drain region by impurity doping, the metal-semiconductor compound region is formed before thermal diffusion of impurities in the substrate. This makes it easy to form the metal-semiconductor compound region which extends to a point under the sidewall from a portion of the source/drain region exposed from the gate structure and the sidewall.

In the method of the tenth aspect, a high stress between the substrate and the sidewall allows the formation of a crystal defect region in the substrate. This makes it possible to form the metal-semiconductor compound region which extends to a point under the sidewall or under the end portion of the gate structure.

In the method of the eleventh aspect, a metallic material used for the formation of the metal-semiconductor compound region is likely to adhere on the side faces of a depression. This encourages lateral silicidation, thus allowing the metal-semiconductor compound region to extend to a point under the sidewall.

In the method of the twelfth aspect, even a portion of the substrate under the end portion of the sidewall on the opposite side of the gate structure is etched to form a depression. This increases the amount of extension of the metal-semiconductor compound region to a point under the sidewall.

In the method of the thirteenth aspect, the depression is formed by the anisotropic etching for the formation of the sidewall. This facilitates the formation of a depression.

In the method of the fourteenth aspect, a metallic material can also adhere to the side faces of a depression properly.

In the method of the fifteenth aspect, the metal-semiconductor compound layer is formed after the upper surface of the gate electrode is dug to a predetermined depth. Thus, the upper surface of the metal-semiconductor compound layer is lower than the upper end portion of the sidewall. This prevents a short circuit in the metal-semiconductor compound layer and in the metal-semiconductor compound region.

In the method of the sixteenth aspect, the metal-semiconductor compound layer is formed after the removal of the mask insulation film. Thus, the upper surface of the metal-semiconductor compound layer is lower than the upper end portion of the sidewall. This prevents a short circuit in the metal-semiconductor compound layer and in the metal-semiconductor compound region.

In the method of the seventeenth aspect, the metal-semiconductor compound region formed within the source/drain region allows suppression of the leakage current flowing from the metal-semiconductor compound region to the substrate.

An object of the present invention is to provide a semiconductor device capable of further reducing source/drain resistance, thereby ensuring higher operating speed of MOS transistors and improved current driving capability, and also to provide a method of manufacturing such a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
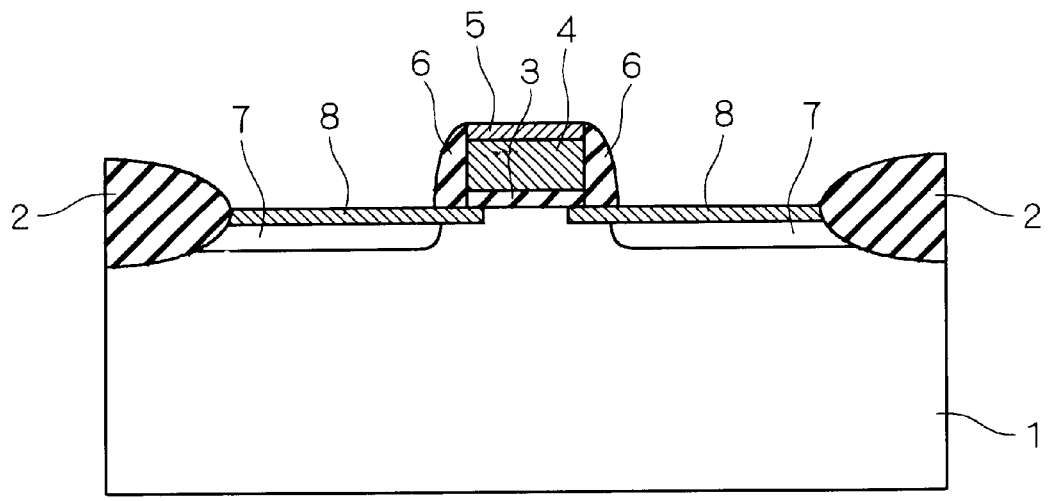
FIG. 1 is a cross-sectional view showing the structure of a semiconductor device according to a first preferred embodiment of the present invention.

FIG. 1 is a cross-sectional view showing the structure of a semiconductor device according to a first preferred embodiment of the present invention. As shown in FIG. 1, the semiconductor device of the first preferred embodiment comprises: a silicon substrate 1; an element isolation insulation film 2 formed in an element isolation region of the silicon substrate 1; a gate structure selectively formed on the main surface of the silicon substrate 1 in an element forming region; and sidewalls 6 formed on the side faces of the gate structure. The gate structure has a laminated structure with a gate insulation film 3, a gate electrode 4, and a cobalt silicide layer 5 stacked in this order. The gate insulation film 3 is formed of a silicon oxide film with a thickness of 20 to 100 Å. The gate electrode 4 is formed of polysilicon, which has a thickness of 500 to 3,000 Å and is doped with impurities such as phosphorous (P) or arsenic (As) in concentrations over $1 \times 10^{20}/cm^3$. The cobalt silicide layer 5 has a thickness of 200 to 600 Å.

The semiconductor device of the first preferred embodiment further comprises: source/drain regions 7 selectively formed in the main surface of the silicon substrate 1 in the element forming region; and cobalt silicide layers 8 formed in the main surface of the silicon substrate 1, each extending to a point under the end portion of the gate structure through the upper surface of the source/drain region 7 exposed from the sidewall 6 and the gate structure.

In this semiconductor device, the cobalt silicide layers 8 having the effect of reducing the source/drain resistance are formed not only in the upper surfaces of the source/drain regions 7 but also under the end portions of the gate structure through the sidewalls 6. In comparison with a conventional semiconductor device, the semiconductor device of the first preferred embodiment thus has reduced sheet resistance in the source/drain regions 7 and improved propagation delay velocity, resulting in higher operating speed of MOS transistors, and further has reduced source/drain resistance, resulting in improved current driving capability.

The above effects become more noticeable as device dimension decreases. The reason is that as the source/drain regions 7 decrease in length with device miniaturization, the length of the cobalt silicide layer 8 located under the sidewall 6 and the gate structure forms an increasingly large proportion of the entire length of the cobalt silicide layer 8. Another reason is that since the channel resistance decreases with device miniaturization, the existence of the cobalt silicide layers 8 under the sidewalls 6 and the gate structure results in reduction in parasitic resistance.

Second Preferred Embodiment

Figure 2:
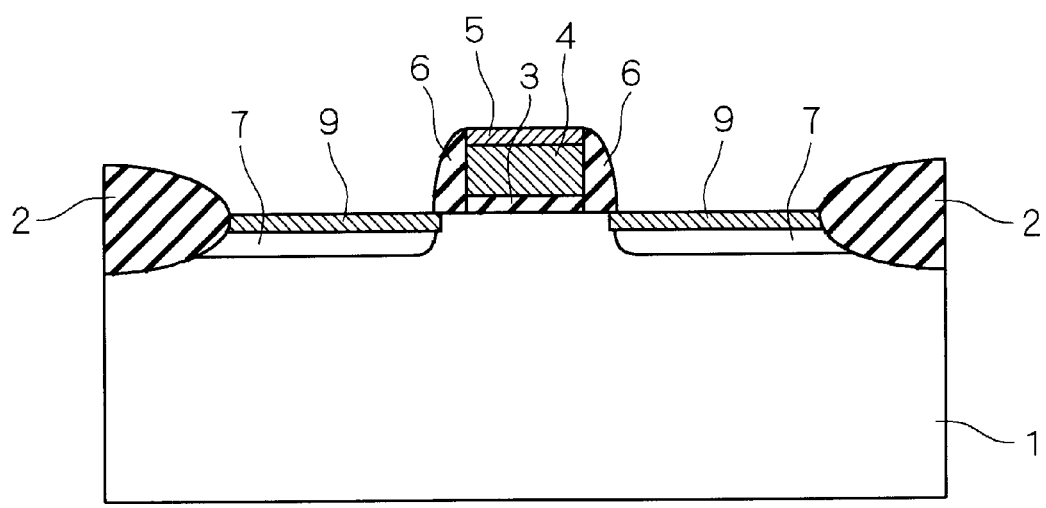
FIG. 2 is a cross-sectional view showing the structure of a semiconductor device according to a second preferred embodiment of the present invention.

FIG. 2 is a cross-sectional view showing the structure of a semiconductor device according to a second preferred embodiment of the present invention. As shown in FIG. 2, the semiconductor device of the second preferred embodiment, based on the device of the first preferred embodiment in FIG. 1, comprises cobalt silicide layers 9, instead of the cobalt silicide layers 8, each of which extends to a point under the sidewall 6 through the upper surface of the source/drain region 7 exposed from the sidewall 6 and the gate structure. That is, the length of the cobalt silicide layers 9 is limited to such an extent that its end portions on the gate-structure side are provided under the sidewalls 6. Otherwise, the structure of the semiconductor device of the second preferred embodiment is identical to that described in the first preferred embodiment.

In this semiconductor device, the cobalt silicide layers 9 having the effect of reducing the source/drain resistance are formed not only in the upper surfaces of the source/drain regions 7 but also under the sidewalls 6. In comparison with a conventional semiconductor device, the semiconductor device of the second preferred embodiment can thus achieve higher operating speed of MOS transistors and improved current driving capability like the device of the first preferred embodiment.

Further, the nonexistence of the cobalt silicide layers 9 under the gate structure prevents a short circuit through the gate insulation film 3 in the gate electrode 4 and the cobalt silicide layers 9.

Third Preferred Embodiment

Figure 3:
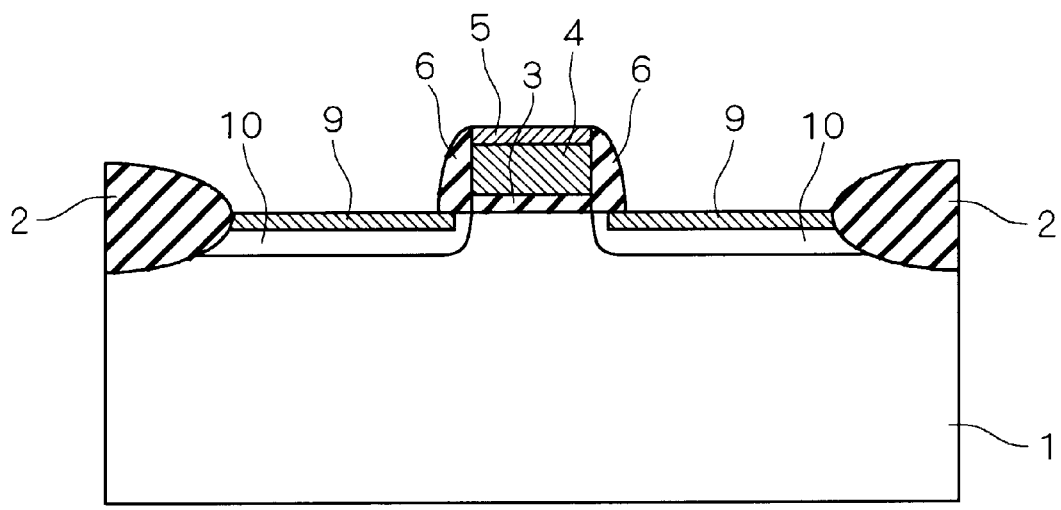
FIG. 3 is a cross-sectional view showing the structure of a semiconductor device according to a third preferred embodiment of the present invention.

FIG. 3 is a cross-sectional view showing the structure of a semiconductor device according to a third preferred embodiment of the present invention. As shown in FIG. 3, the semiconductor device of the third preferred embodiment, based on the device of the second preferred embodiment in FIG. 2, comprises source/drain regions 10, instead of the source/drain regions 7, which further extend toward the gate structure beyond the end portions of the cobalt silicide layers 9 on the gate-structure side. The cobalt silicide layers 9 are thus formed within the source/drain region 10. Such source/drain regions 10 are formed for example by high-temperature or prolonged heat treatment. Otherwise, the structure of the semiconductor device of the third preferred embodiment is identical to that described in the second preferred embodiment.

Since the cobalt silicide layers 9 are formed in the source/drain regions 10, the semiconductor device of the third preferred embodiment can suppress leakage current flowing from the cobalt silicide layers 9 to the silicon substrate 1 as well as having the effect of the semiconductor device of the second preferred embodiment.

While the above-described semiconductor device of the third preferred embodiment is based on that of the second preferred embodiment, it is needless to say that the same effects will be obtained even with the device of the first preferred embodiment as a basis.

Fourth Preferred Embodiment

Figure 4:
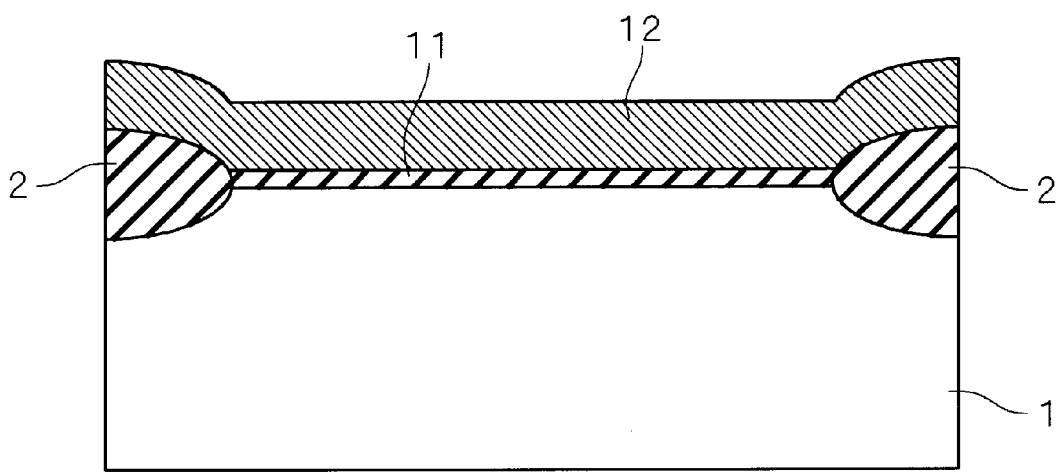
FIGS. 4 through 13 are cross-sectional views illustrating, in order of successive steps, a method of manufacturing a semiconductor device according to a fourth preferred embodiment of the present invention.

FIGS. 4 through 13 are cross-sectional views illustrating, in order of successive steps, a method of manufacturing a semiconductor device according to a fourth preferred embodiment of the present invention. The element isolation insulation film 2 formed of a silicon oxide film is first formed in the element isolation region of the silicon substrate 1 and a silicon oxide film 11 with a thickness of 10 to 200 Å is formed on the main surface of the silicon substrate 1 in the element forming region. The silicon oxide film 11 may be replaced by a nitride film, a metal oxide film, or an insulation film which is a combination of a nitride film and a metal oxide film. Then, a polysilicon film 12 with a thickness of 500 to 3000 Å is formed by CVD methods over the entire surface (FIG. 4). The polysilicon film 12 may be doped with impurities such as P during the CVD process or by ion implantation after the CVD process, or it may not be doped with any impurity. Still alternatively, the polysilicon film 12 may contain impurities such as fluorine (F) or nitrogen (N).

Figure 5:
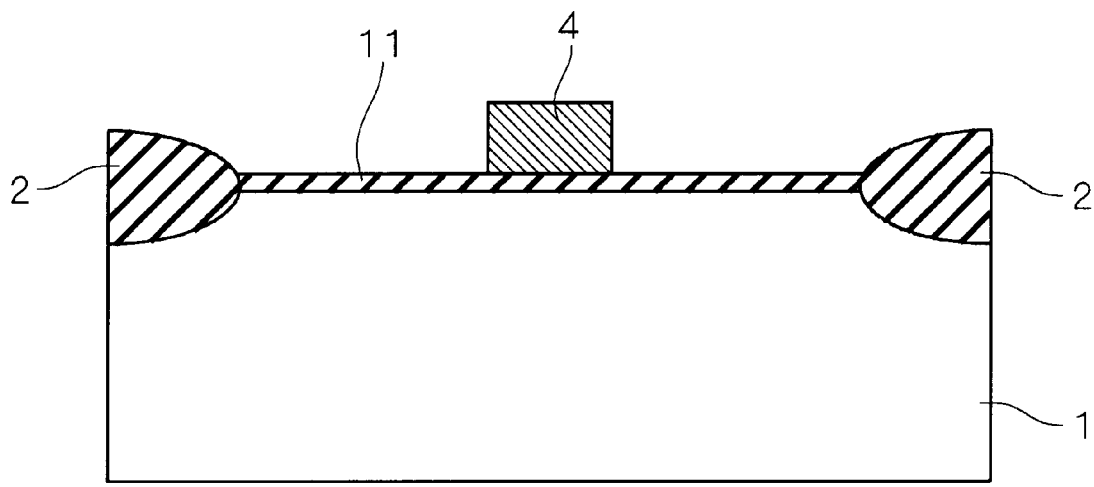

After a resist with a predetermined opening pattern is formed on the polysilicon film 12 by photolithographic techniques, the polysilicon film 12 is etched by anisotropic dry etching to form the gate electrode 4. The resist is then removed (FIG. 5).

Figure 6:
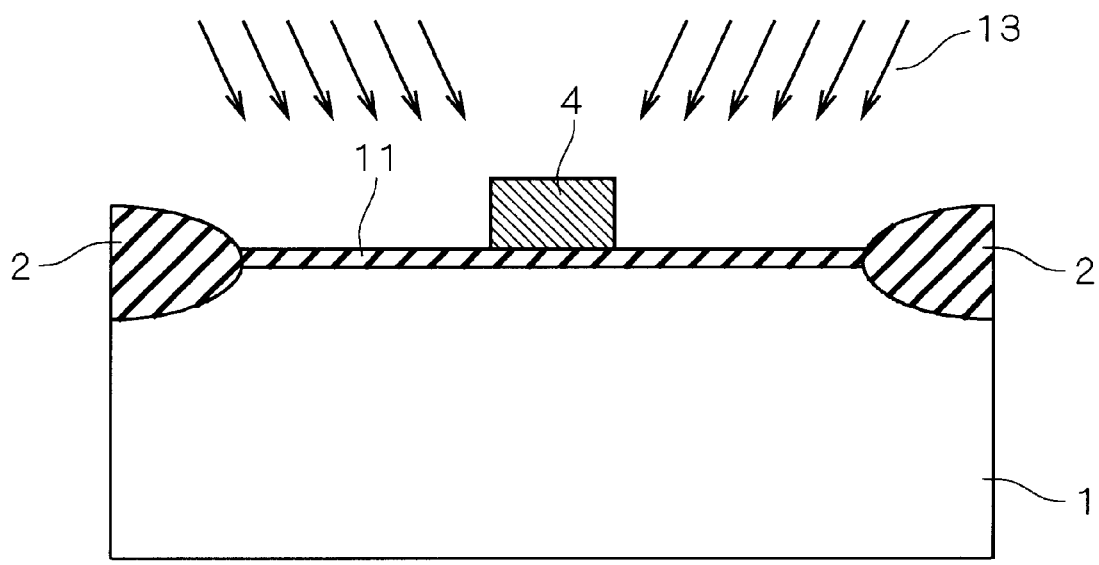

Boron ions 13 are implanted into the silicon substrate 1 at 1 to 50 keV with doses of $1\times10^{13}$ to $1\times10^{14}/cm^2$ at any angle from 0 to 60 degrees with respect to the normal to the main surface of the silicon substrate 1, whereby a pocket layer (not shown) is formed to prevent punch-through (FIG. 6).

Figure 7:
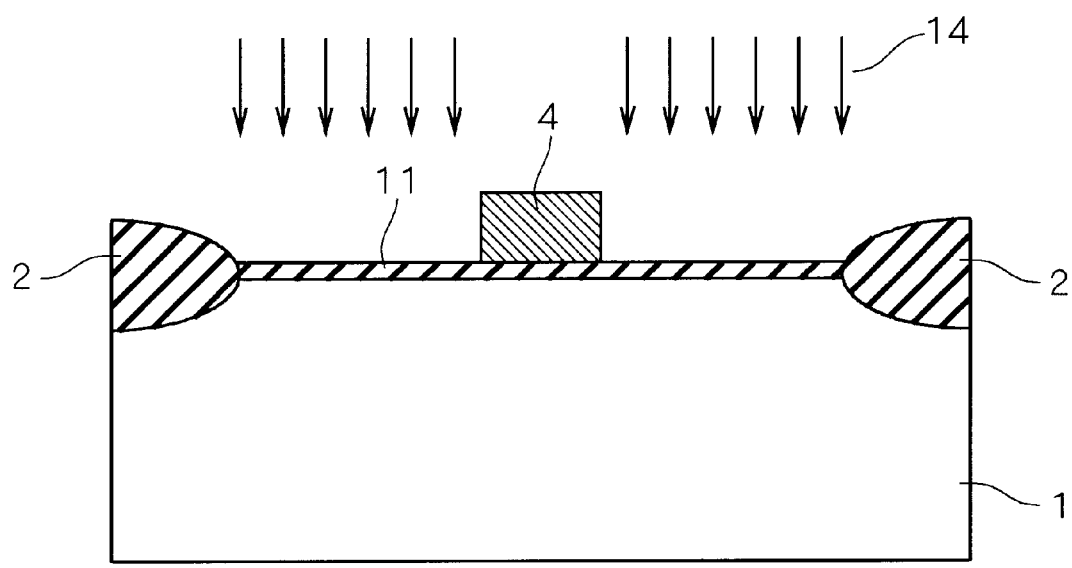
Figure 8:
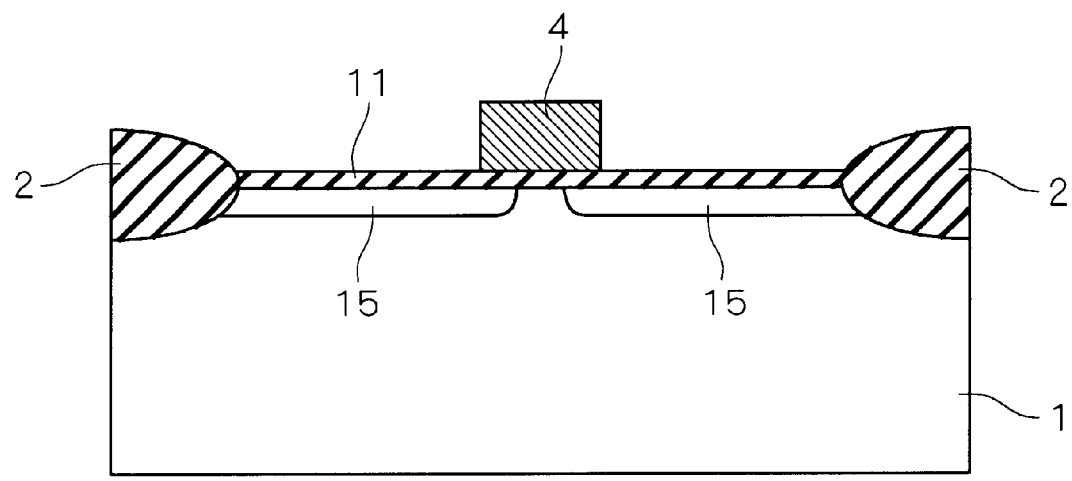

Further, arsenic ions 14 or phosphorous ions are implanted into the silicon substrate 1 at 1 to 50 keV with doses of $1\times10^{14}$ to $4\times10^{15}/cm^2$ (FIG. 7). Before the implantation of arsenic ions 14, another ion implantation for preventing channeling may be performed by changing the surface of the silicon substrate 1 into amorphous. Following this, heat treatment is carried out to form first diffusion regions 15 of high concentration (impurity concentration of over $1\times10^{19}/cm^3$) in the main surface of the silicon substrate 1 (FIG. 8). Specifically, the semiconductor device of the fourth preferred embodiment is intended not for MOS transistors having IDD (Lightly-doped Drain) structures for suppression of hot carrier, with the source voltage of over 2.5 V, but for low-voltage MOS transistors with the source voltage of about 1.8 V. The same goes for other preferred embodiments.

Figure 9:
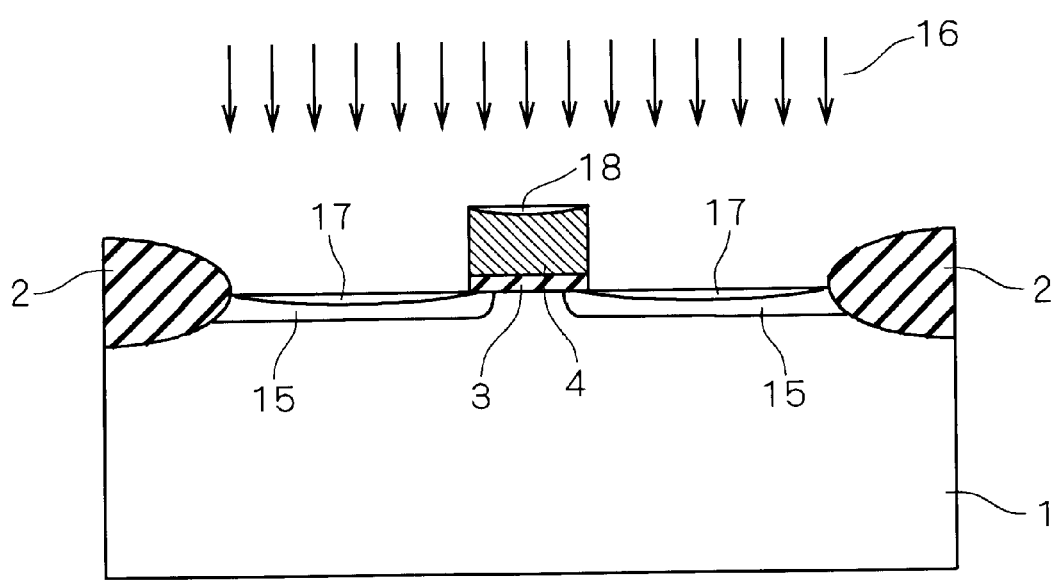

After the silicon oxide film 11 except that under the gate electrode 4 is removed to form the gate insulation film 3, silicon ions 16 or heavy ions such as germanium (G), antimony (Sb), or indium (In) are implanted into the main surface of the silicon substrate 1 and the upper surface of the gate electrode 4 at 5 to 20 keV with doses of $1\times10^{14}$ to $1\times10^{16}/cm^2$ at any angle from 0 to 9 degrees with respect to the normal to the main surface of the silicon substrate 1. This will produce amorphous regions 17 and 18 in the main surface of the silicon substrate 1 and in the upper surface of the gate electrode 4, respectively. At this time, the implanted heavy ions in the silicon substrate 1 scatter not only in the depth direction of the silicon substrate 1 but also in the lateral direction (i.e., side-to-side direction on the drawing paper). This causes part of the silicon substrate 1 under the gate insulation film 3 to be changed into amorphous, resulting in the end portions of the respective amorphous regions 17 on the gate-structure side reaching under the end portions of the gate insulation film 3 (FIG. 9).

Figure 10:
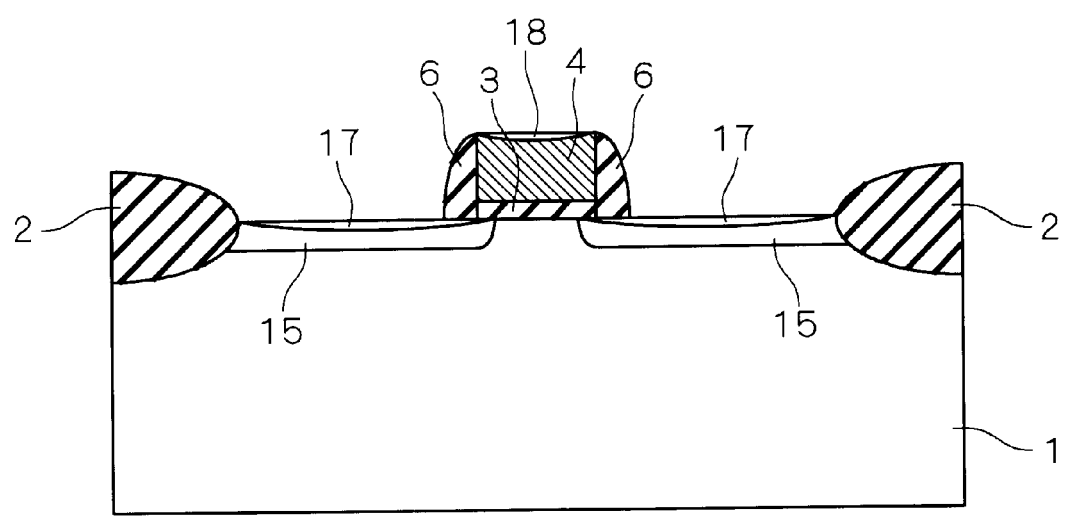

Then, a silicon oxide film with a thickness of from 100 to 2,000 Å is formed by CVD methods over the entire surface and is etched by a high etch rate of anisotropic etching in the depth direction of the silicon substrate 1, whereby the sidewalls 6 are formed on the side faces of the gate structure (FIG. 10). Alternatively, the sidewall 6 may be, instead of a silicon oxide film, a silicon nitride film with an underlying silicon oxide film.

Figure 11:
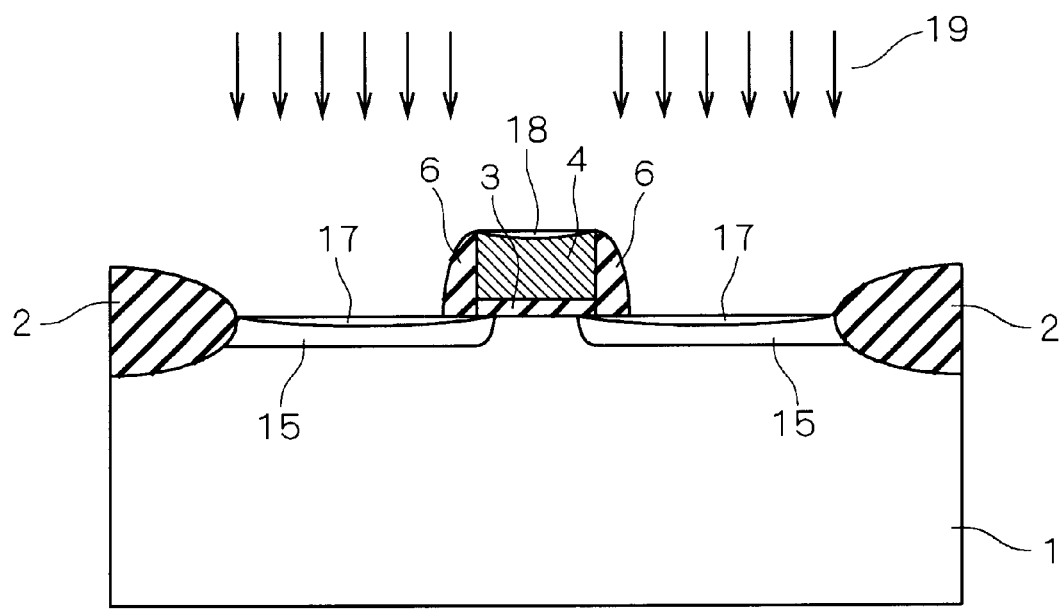
Figure 12:
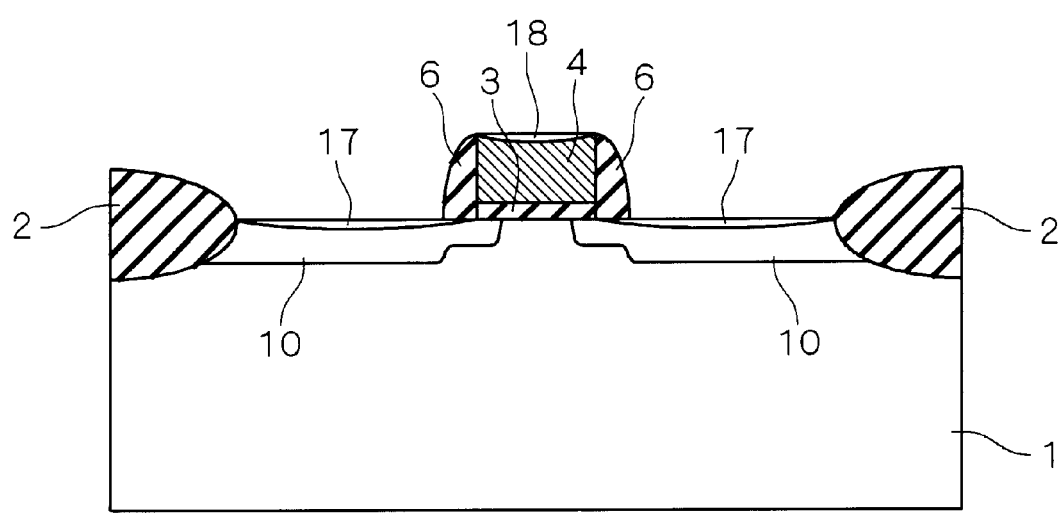

Arsenic ions 19 are further implanted into the silicon substrate 1 at 10 to 100 keV with doses of $1\times10^{15}$ to $8\times10^{15}/cm^2$ (FIG. 11). Following this, heat treatment is carried out at 400 to 1000° C. for 1 sec. to 360 min. to form the source/drain regions 10 in the main surface of the silicon substrate 1 (FIG. 12).

Figure 13:
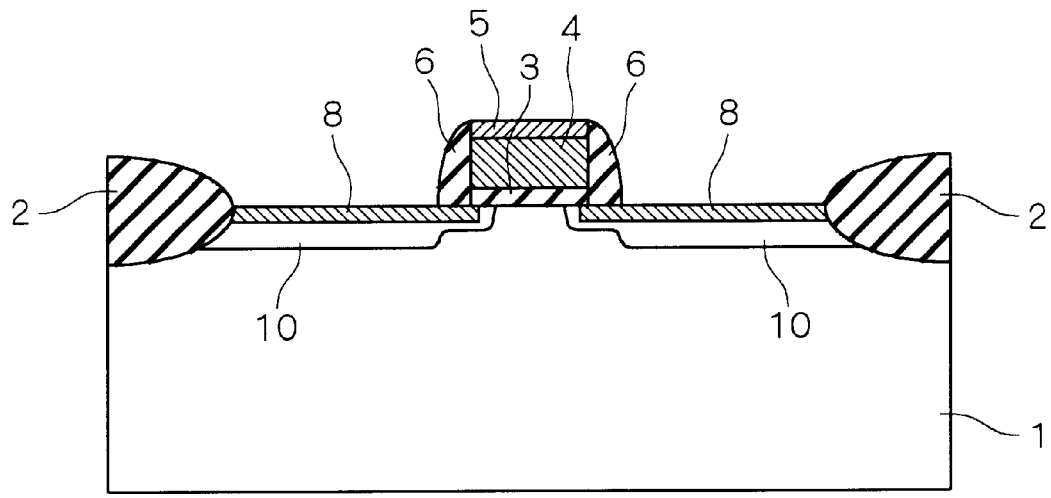

After a cobalt film with a thickness of 10 to 160 Å is formed over the entire surface by a sputtering method, heat treatment is carried out. This will cause silicidation of the amorphous regions 17 and 18, resulting in the formation of the cobalt silicide layers 8 and 5. The unreacted cobalt film is then removed (FIG. 13).

In the above description, the cobalt silicide layer is taken as an example of metal silicide, but it may be other silicide such as tungsten (W), nickel (Ni), platinum (Pt), tantalum (Ta), titanium (Ti), or molybdenum (Mo). Further, the structure of an MOS transistor does not have to be symmetrical at left and right. The same applies to the other preferred embodiments.

In the method of manufacturing a semiconductor device according to the fourth preferred embodiment, before the formation of the sidewalls 6, portions of the silicon substrate 1 where the cobalt silicide layers 8 are to be formed are changed into amorphous to form the amorphous regions 17, and after the formation of the sidewalls 6, the cobalt silicide layers 8 are formed by silicidation of the amorphous regions 17. This allows each of the cobalt silicide layers 8 to appropriately extend to a point under the end portion of the gate structure through the upper surface of the source/drain region 10 exposed from the gate structure.

Fifth Preferred Embodiment

Figure 14:
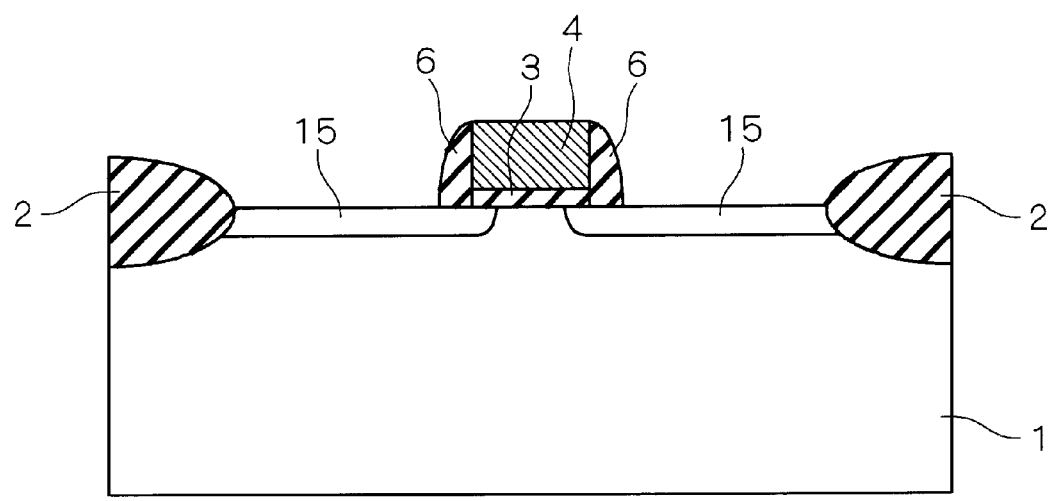
FIGS. 14 through 17 are cross-sectional views illustrating, in order of successive steps, a method of manufacturing a semiconductor device according to a fifth preferred embodiment of the present invention.

FIGS. 14 through 17 are cross-sectional views illustrating, in order of successive steps, a method of manufacturing a semiconductor device according to a fifth preferred embodiment of the present invention. First, a similar structure to FIG. 8 is obtained in the same way as in the fourth preferred embodiment. After the gate insulation film 3 is formed by removing the silicon oxide film 11 except that under the gate electrode 4, the sidewalls 6 are formed on the side faces of the gate structure (FIG. 14).

Figure 15:
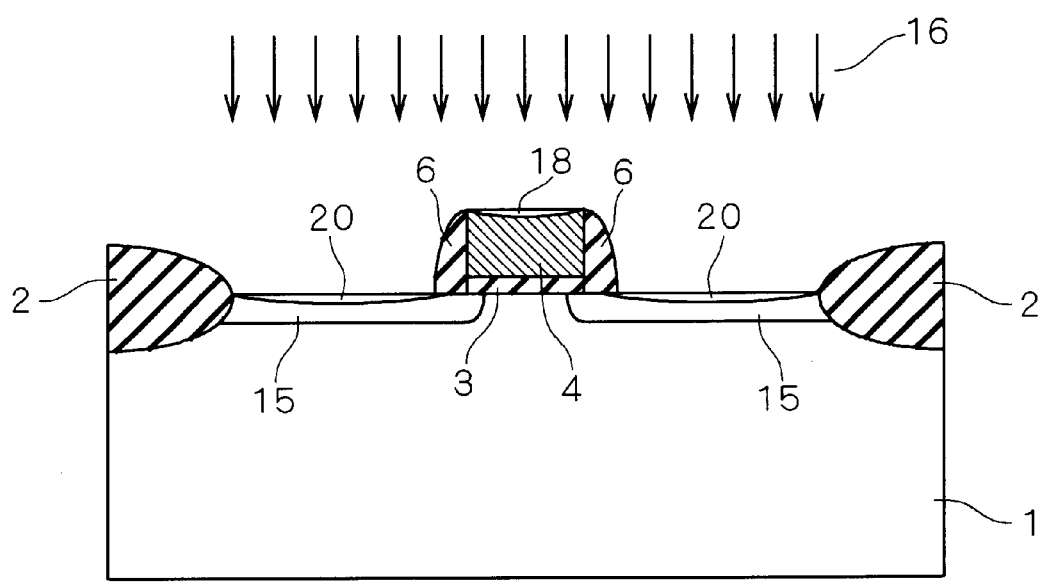

Then, silicon ions 16 or heavy ions such as G, Sb, In are implanted into the main surface of the silicon substrate 1 and the upper surface of the gate electrode 4 at 5 to 20 keV with doses of $1 \times 10^{14}$ to $1 \times 10^{16}/cm^2$ at any angle from 0 to 9 degrees with respect to the normal to the main surface of the silicon substrate 1. This will produce amorphous regions 20 and 18 in the main surface of the silicon substrate 1 and in the upper surface of the gate electrode 4, respectively (FIG. 15).

Figure 16:
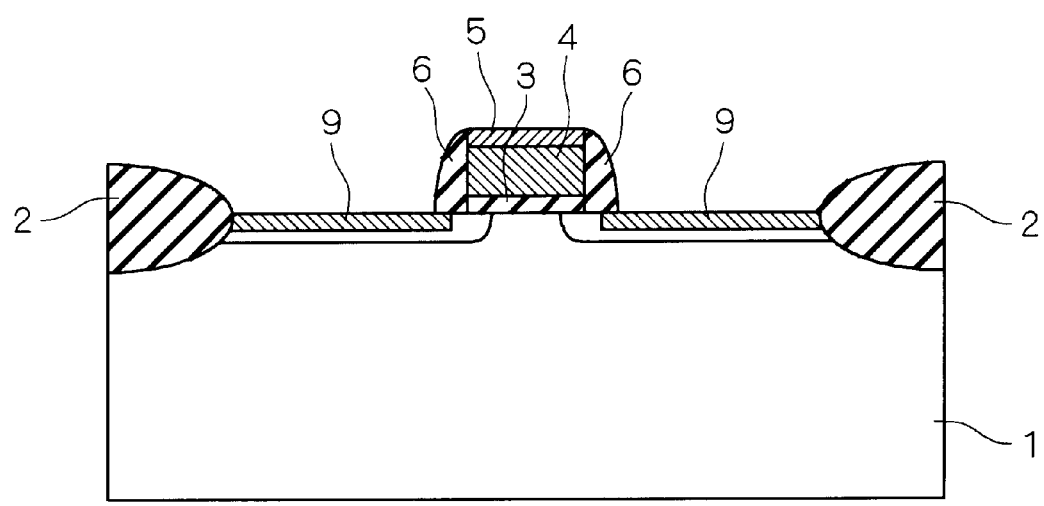

After a cobalt film with a thickness of 10 to 160 Å is formed across the surface by a sputtering method, heat treatment is carried out. This will cause silicidation of the amorphous regions 20 and 18, resulting in the formation of the cobalt silicide layers 9 and 5. The unreacted cobalt film is then removed (FIG. 16).

Figure 17:
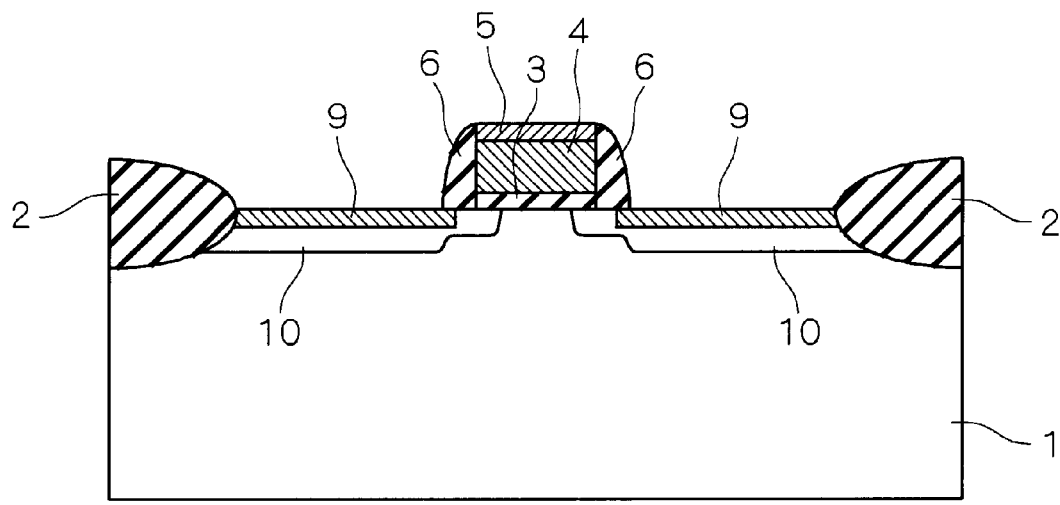

Further, arsenic ions are implanted into the silicon substrate 1 and heat treatment is carried out to form the source/drain regions 10 in the main surface of the silicon substrate 1 (FIG. 17).

In the method of manufacturing a semiconductor device according to the fifth preferred embodiment, after the formation of the sidewalls 6, portions of the silicon substrate 1 where the cobalt silicide layers 9 are to be formed are changed into amorphous to form the amorphous region 20, and then the cobalt silicide layers 9 are formed by silicidation of the amorphous regions 20. This allows each of the cobalt silicide layers 9 to appropriately extend to,a point under the sidewall 6 through the upper surface of the source/drain region 10 exposed from the sidewall 6 and the gate structure.

Sixth Preferred Embodiment

Figure 18:
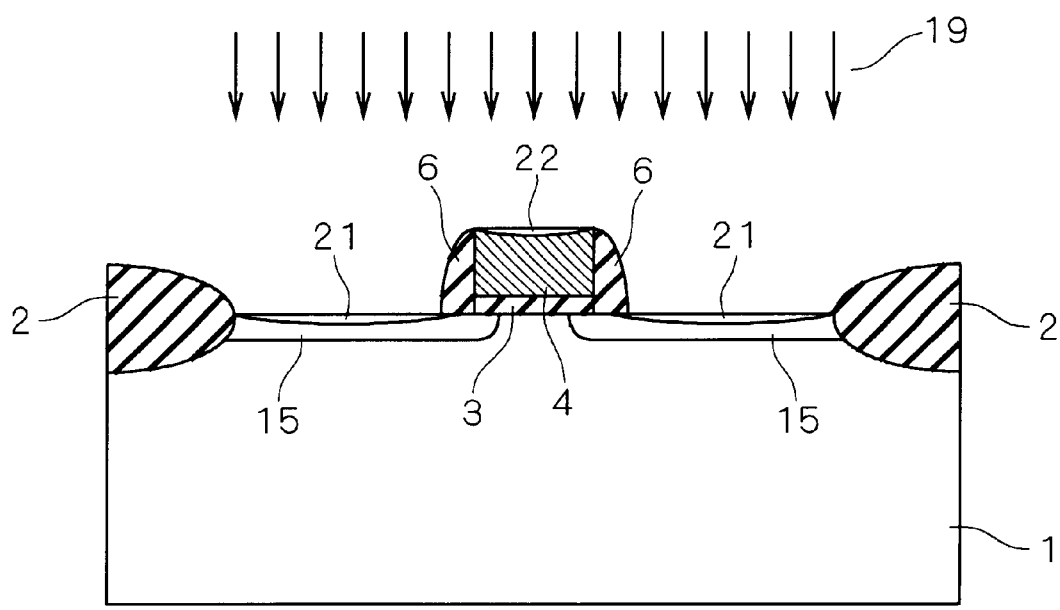
FIGS. 18 and 19 are cross-sectional views illustrating, in order of successive steps, a method of manufacturing a semiconductor device according to a sixth preferred embodiment of the present invention.
Figure 19:
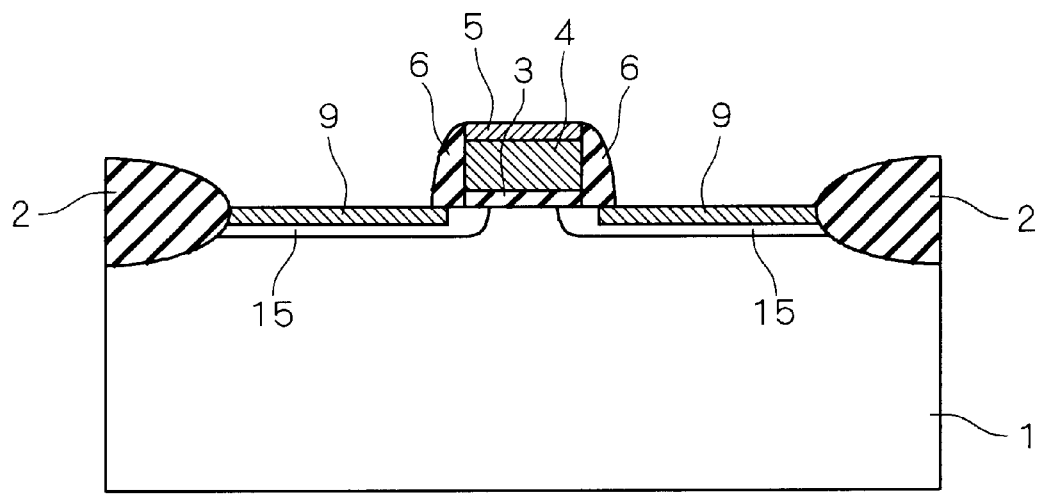

FIG. 18 and 19 are cross-sectional views illustrating, in order of successive steps, a method of manufacturing a semiconductor device according to a sixth preferred embodiment of the present invention. First, a similar structure to FIG. 14 is obtained in the same way as in the fifth preferred embodiment. Then, arsenic ions 19 are implanted into the silicon substrate 1 at 10 to 100 keV with doses of $1 \times 10^{15}$ to $8 \times 10^{15}/cm^2$ to form the source/drain regions 10. The implantation of arsenic ions 19 will simultaneously produce amorphous regions 21 in the main surface of the silicon substrate 1. The implanted arsenic ions 19 scatter not only in the depth direction of the silicon substrate 1 but also in the lateral direction. This will cause part of the silicon substrate 1 under the sidewalls 6 to be changed into amorphous, resulting in the end portions of the amorphous regions 21 on the gate-structure side reaching under the sidewalls 6. The arsenic ions 19 are also implanted into the upper surface of the gate electrode 4, whereby an amorphous region 22 is formed in the upper surface of the gate electrode 4 (FIG. 18).

After a cobalt film with a thickness of 10 to 160 Å is formed by a sputtering method, heat treatment is carried out. This will cause silicidation of the amorphous regions 21 and 22, resulting in the formation of the cobalt silicide layers 9 and 5. The unreacted cobalt film is then removed (FIG. 19).

The arsenic ions 19 implanted in the silicon substrate 1 are thermally diffused by heat treatment at 400 to 1100° C. for 1 sec. to 360 min. to form the source/drain regions in the main surface of the silicon substrate 1.

In the method of manufacturing a semiconductor device according to the sixth preferred embodiment, by utilizing the fact that the implantation of the arsenic ions 19 for the formation of the source/drain regions 10 also produces the amorphous regions 21, the cobalt silicide layers 9 are formed before the thermal diffusion of the arsenic ions 19. This makes it easy to form the cobalt silicide layers 9 each extending to a point under the sidewall 6 through the upper surface of the source/drain region 10 exposed from the sidewall 6 and the gate structure.

Seventh Preferred Embodiment

Figure 20:
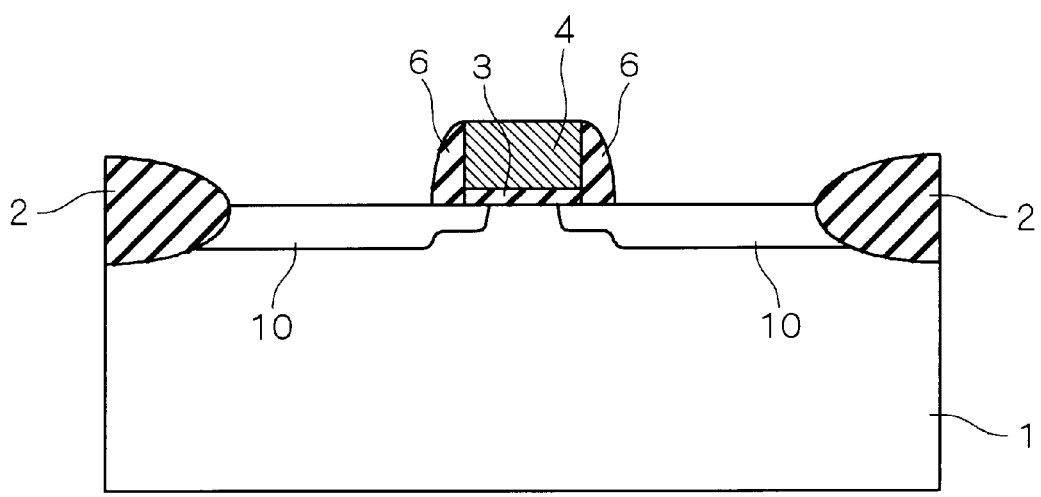
FIGS. 20 and 21 are cross-sectional views illustrating, in order of successive steps, a method of manufacturing a semiconductor device according to a seventh preferred embodiment of the present invention.
Figure 21:
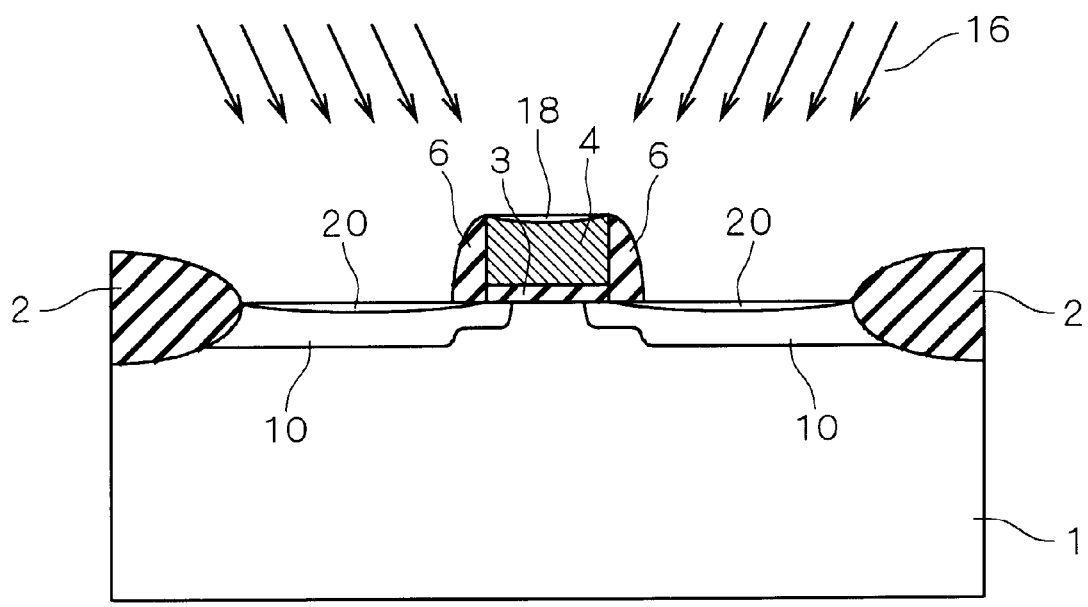

FIGS. 20 and 21 are cross-sectional views illustrating, in order of successive steps, a method of manufacturing a semiconductor device according to a seventh preferred embodiment. First, a similar structure to FIG. 14 is obtained in the same way as in the fifth preferred embodiment. After arsenic ions are implanted into the silicon substrate 1, heat treatment is carried out to form the source/drain regions 10 in the main surface of the silicon substrate 1 (FIG. 20).

Along with the rotation of the wafer, heavy ions such as silicon ions 16 are implanted into the main surface of the silicon substrate 1 at 5 to 20 keV with doses of $1 \times 10^{14}$ to $1 \times 10^{16}/cm^2$ at any angle from 7 to 45 degrees with respect to the normal to the main surface of the silicon substrate 1. This will produce the amorphous regions 20 in the main surface of the silicon substrate 1 and the amorphous region 18 in the upper surface of the gate electrode 4 (FIG. 21). Then, a cobalt film is formed across the surface by a sputtering method and heat treatment is carried out to form the cobalt silicide layers 9 and 5. The unreacted cobalt film is then removed.

In the method of manufacturing a semiconductor device according to the seventh preferred embodiment, in order to form the amorphous regions 20, silicon ions 16 are angularity implanted in the silicon substrate 1 relative to the normal to the main surface of the silicon substrate 1. This increases the amount of extension of the amorphous regions 20 under the sidewalls 6 as compared with that in the method of the fifth preferred embodiment (FIG. 15) wherein silicon ions 16 are implanted almost in parallel with the normal to the main surface of the silicon substrate 1.

Now, in the method of manufacturing a semiconductor device according to the fourth preferred embodiment, the implantation of silicon ions 16 into the silicon substrate 1 in the step of FIG. 9 may be performed at any angle from 7 to 45 degrees with respect to the normal to the main surface of the silicon substrate 1. This also increases the amount of extension of the amorphous regions 17 under the gate structure.

Eighth Preferred Embodiment

Figure 22:
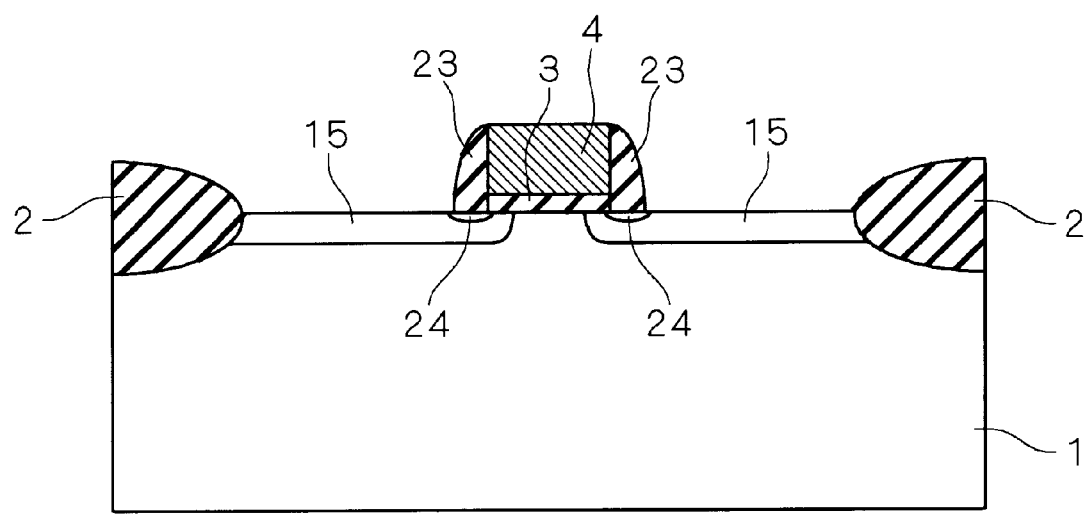
FIGS. 22 and 23 are cross-sectional views illustrating, in order of successive steps, a method of manufacturing a semiconductor device according to an eighth preferred embodiment of the present invention.
Figure 23:
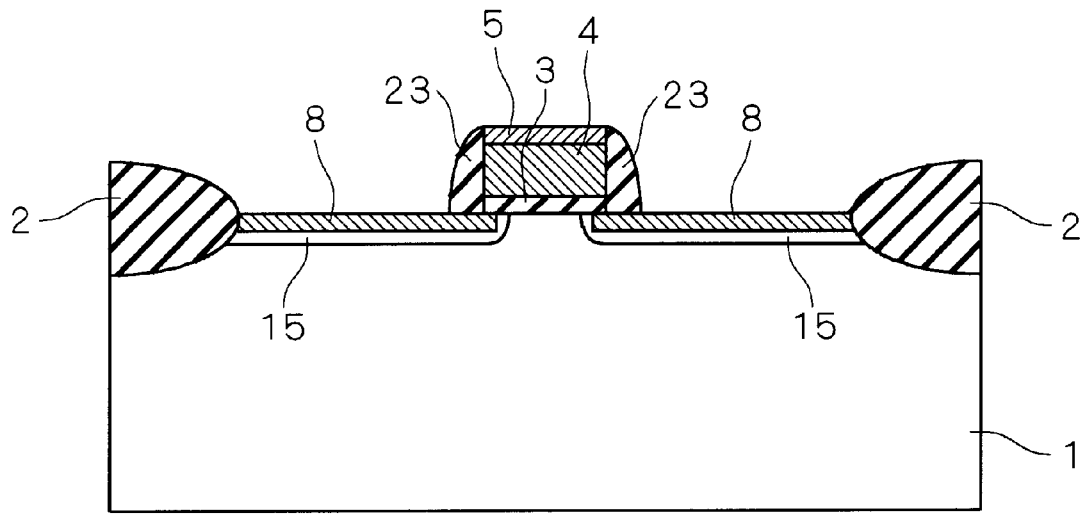

FIGS. 22 and 23 are cross-sectional views illustrating, in order of successive steps, a method of manufacturing a semiconductor device according to an eight preferred embodiment of the present invention. First, a similar structure to FIG. 8 is obtained in the same way as in the fourth preferred embodiment. After the gate insulation film 3 is formed by removing the silicon oxide film 11 except that under the gate electrode 4, a silicon nitride film with a thickness of 100 to 3000 Å is formed over the entire surface by CVD methods. The silicon nitride film is then etched back by a high etch rate of anisotropic dry etching in the depth direction of the silicon substrate 1 to form sidewalls 23 of silicon nitride films on the side faces of the gate structure. Here a high stress caused by the silicon nitride film and the silicon substrate 1 causes great distortion at the interfaces between the sidewalls 23 and the first diffusion regions 15, whereby crystal defect regions 24 are formed (FIG. 22).

After a cobalt film is formed across the surface by a sputtering method, heat treatment is carried out to form the cobalt silicide layers 8 and 5. The unreacted cobalt film is then removed (FIG. 23).

In the method of manufacturing a semiconductor device according to the eighth preferred embodiment, the sidewalls 23 made of materials that produce high stress with the silicon substrate 1 are formed on the side faces of the gate structure. This high stress produces the crystal defect regions 24, thereby allowing each of the cobalt silicide layers 9 and 8 to appropriately extend to a point under the sidewall 6 or under the end portion of the gate structure through the upper surface of the source/drain region 10 exposed from the gate structure and the sidewall 23.

Ninth Preferred Embodiment

Figure 24:
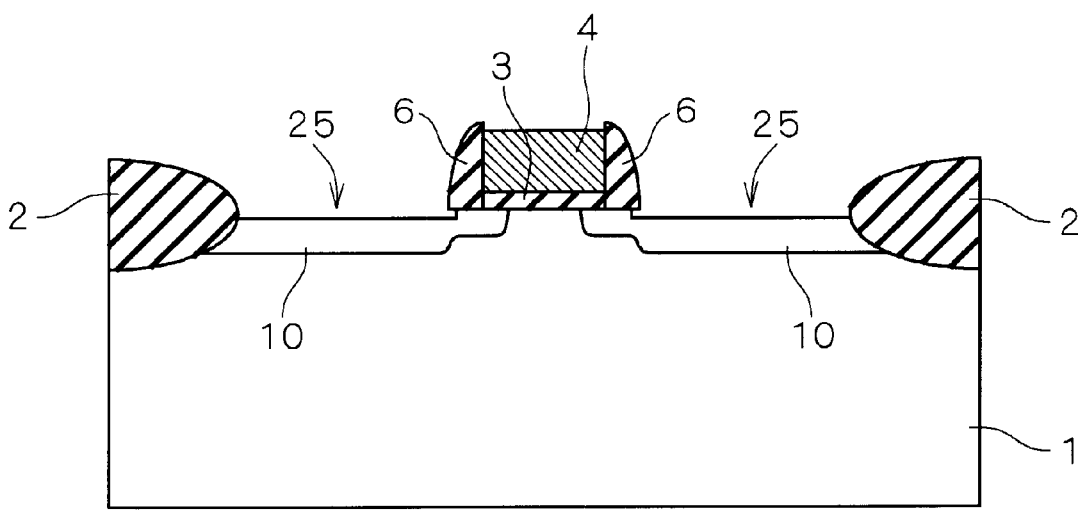
FIGS. 24 and 25 are cross-sectional views illustrating, in order of successive steps, a method of manufacturing a semiconductor device according to a ninth preferred embodiment of the present invention.
Figure 25:
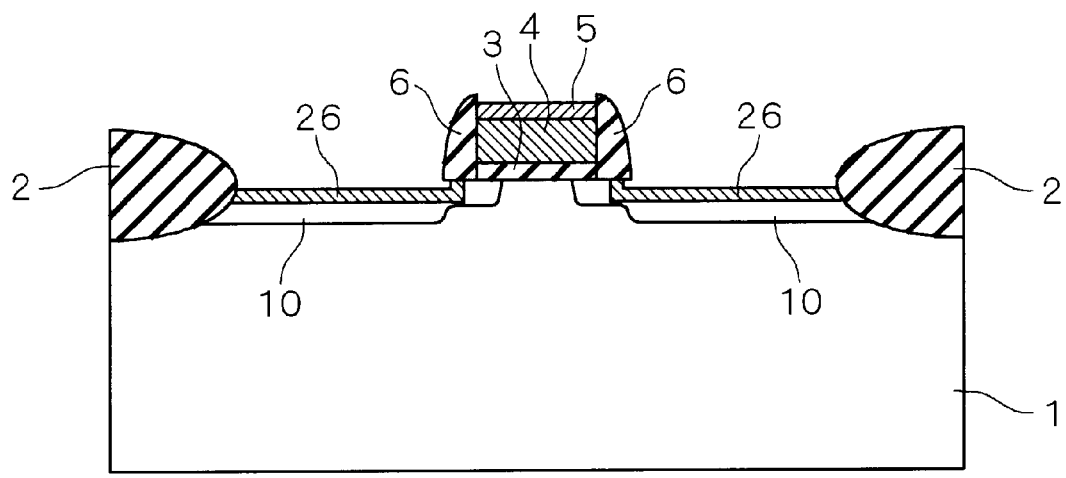

FIGS. 24 and 25 are cross-sectional views illustrating, in order of successive steps, a method of manufacturing a semiconductor device according to a ninth preferred embodiment of the present invention. First, a similar structure to FIG. 20 is obtained in the same way as in the seventh preferred embodiment. The exposed main surface of the silicon substrate 1 is then selectively etched by isotropic etching to form depressions 25. Simultaneously, the upper surface of the gate electrode 4 is also etched selectively (FIG. 24).

After a cobalt film is formed across the surface by a sputtering method, heat treatment is carried out to form cobalt silicide layers 26 and 5. The unreacted cobalt film is then removed (FIG. 25).

In the method of manufacturing a semiconductor device according to the ninth preferred embodiment, before the formation of a cobalt film by sputtering, the depressions 25 are previously formed by digging in the main surface of the silicon substrate 1. Since metallic materials are likely to adhere on the side faces of the depressions 25 in the sputtering process, lateral growth of cobalt silicide is encouraged. This allows each of the cobalt silicide layers 26 to appropriately extend to a point under the sidewall 6 through the upper surface of the source/drain region 10 exposed from the gate structure and the sidewall 6.

Further, the cobalt silicide layer 5 is formed after the upper surface of the gate electrode 4 is dug in to a predetermined depth. Thus, the upper surface of the cobalt silicide layer 5 is lower than the upper end portions of the sidewalls 6. This prevents a short circuit in the cobalt silicide layer 5 and in the cobalt silicide layer 26 or the source/drain regions 10.

Tenth Preferred Embodiment

Figure 26:
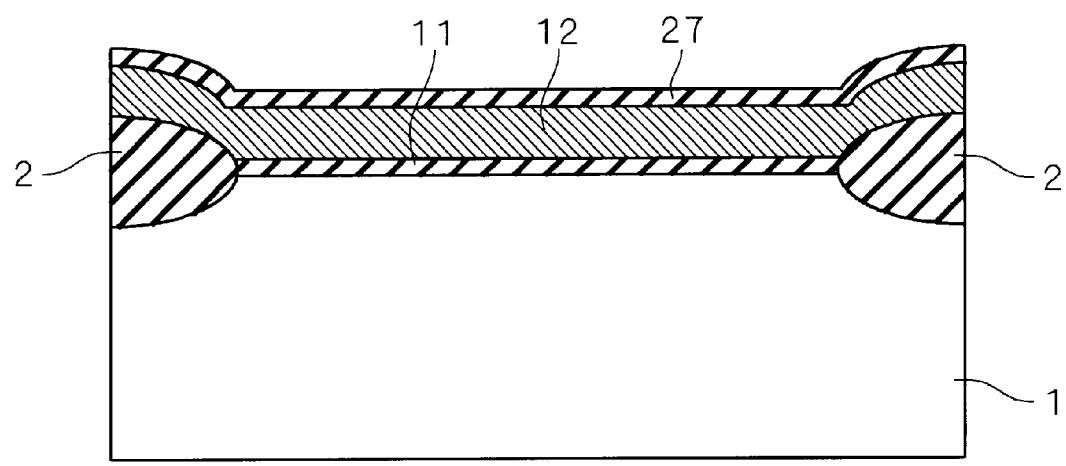
FIGS. 26 through 31 are cross-sectional views illustrating, in order of successive steps, a method of manufacturing a semiconductor device according to a tenth preferred embodiment of the present invention.

FIGS. 26 through 31 are cross-sectional views illustrating, in order of successive steps, a method of manufacturing a semiconductor device according to a tenth preferred embodiment of the present invention. First, a similar structure to FIG. 4 is obtained in the same way as in the fourth preferred embodiment. Then, a mask oxide film 27 with a thickness of 300 to 3000 Å is formed on the polysilicon film 12 by CVD methods (FIG. 26).

Figure 27:
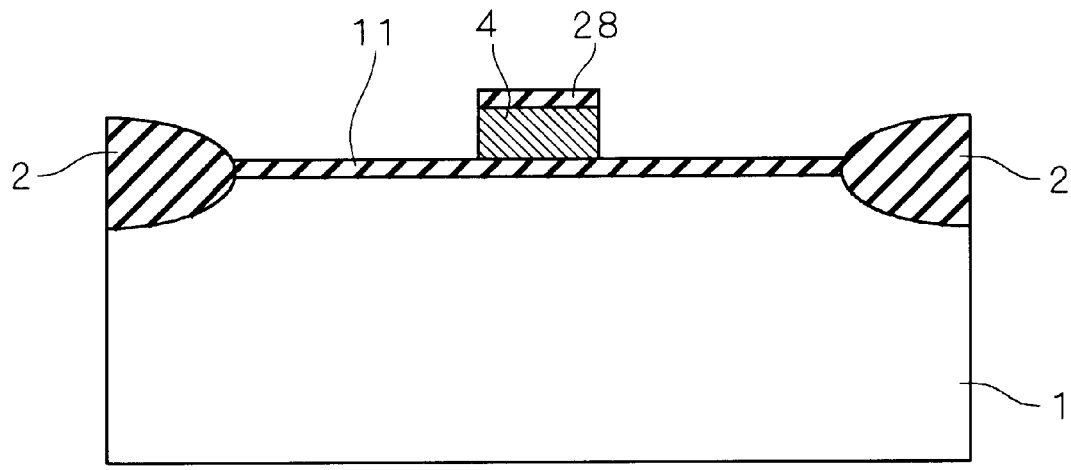

After a resist with a predetermined opening pattern is formed on the mask oxide film 27 by photolithographic techniques, the mask oxide film 27 and the polysilicon film 12 are etched by anisotropic dry etching. This will produce the gate electrode 4 with its upper surface covered with the mask oxide film 28. The resist is then removed (FIG. 27).

Figure 28:
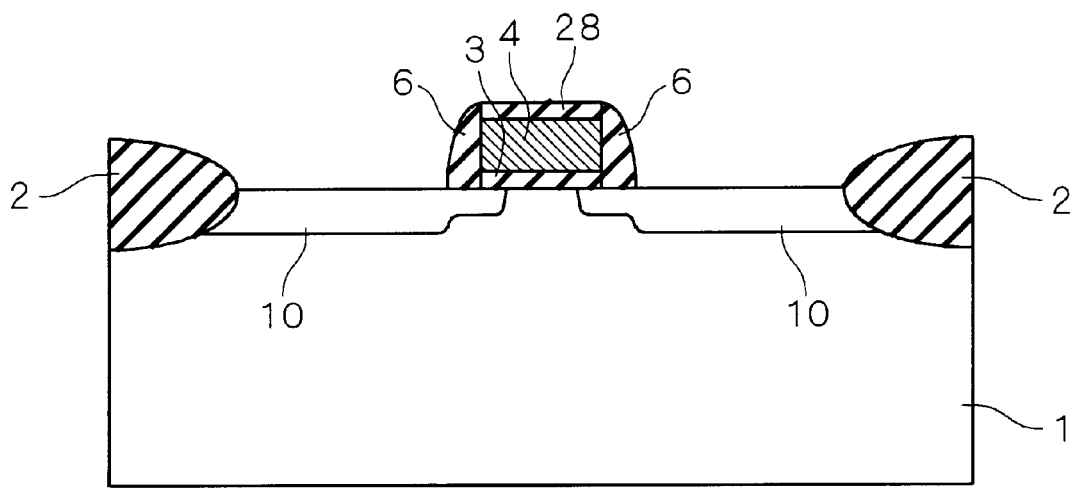

Now boron ions are implanted into the silicon substrate 1 to form a pocket layer and arsenic ions are implanted into the silicon substrate 1 for heat treatment to thereby form the first diffusion regions in the main surface of the silicon substrate 1. After the gate insulation film 3 is formed by removing the silicon oxide film 11 except that under the gate electrode 4, the sidewalls 6 formed of silicon oxide films are formed on the side faces of the gate structure. The gate structure has a laminated structure with the gate insulation film 3, the gate electrode 4, and the mask oxide film 28 stacked in this order. Then, heat treatment is carried out after implanting arsenic ions into the silicon substrate 1 to thereby form the source/drain regions 10 in the main surface of the silicon substrate 1 (FIG. 28).

Figure 29:
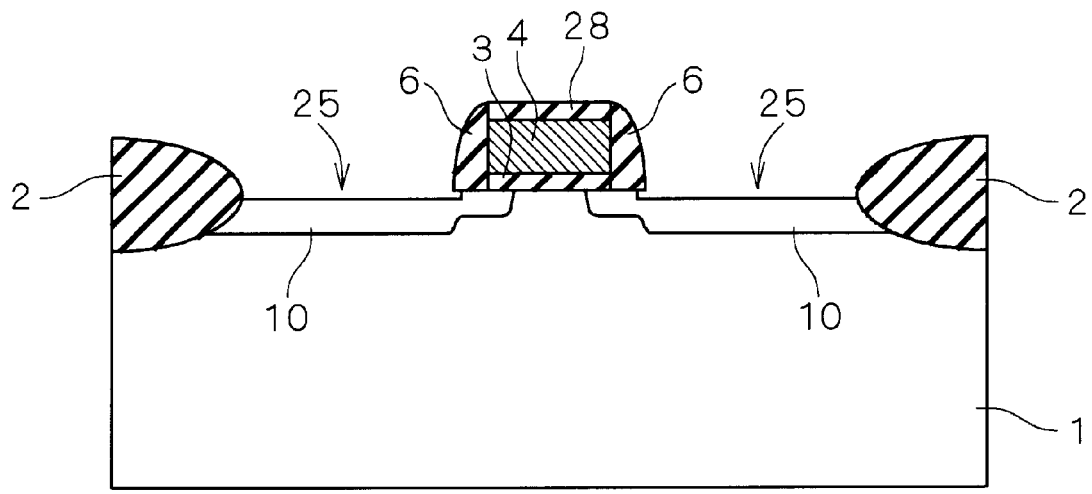
Figure 30:
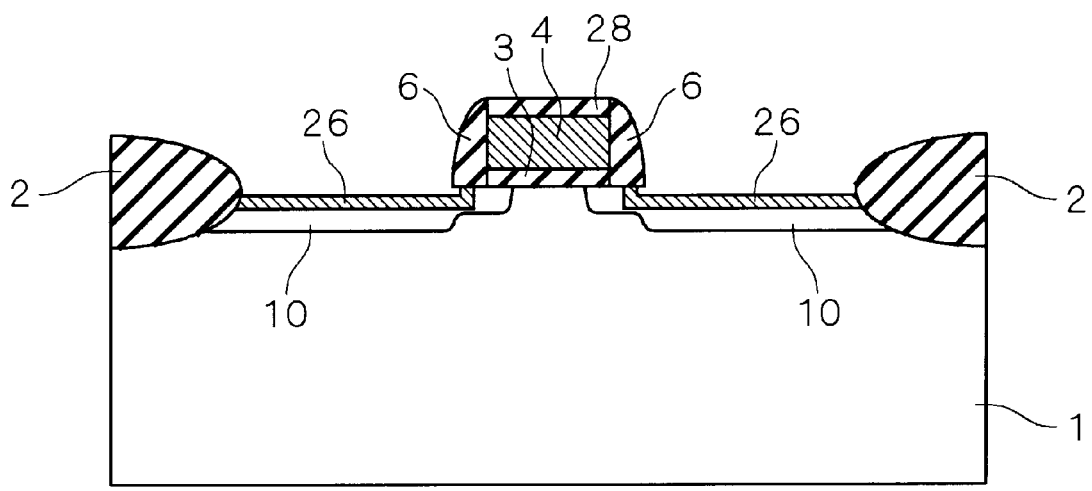

The exposed main surface of the silicon substrate 1 is selectively etched by isotropic etching to form the depressions 25 (FIG. 29). After a cobalt film is formed over the entire surface by sputtering, heat treatment is carried out to form the cobalt silicide layers 26. The unreacted cobalt film is then removed (FIG. 30).

Figure 31:
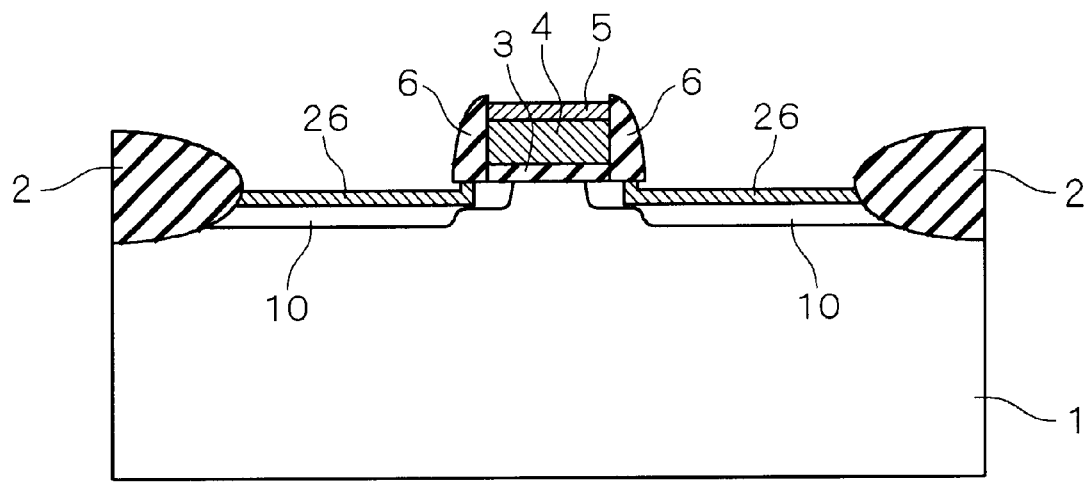

In cases where silicidation of the upper surface of the gate electrode 4 is required, the mask oxide film 28 should be removed by wet etching after the step of FIG. 29. This removal makes it possible to form a cobalt film on the upper surface of the gate electrode 4, thereby allowing the cobalt silicide layer 5 to be formed by heat treatment (FIG. 31).

In the method of manufacturing a semiconductor device according to the tenth preferred embodiment, before the formation of a cobalt film by sputtering, the depressions 25 are previously formed by digging in the main surface of the silicon substrate 1. This allows each of the cobalt silicide layers 26 to extend to a point under the sidewall 6 by the same reason as in the ninth preferred embodiment.

Further, since the cobalt silicide layer 5 is formed after the removal of the mask oxide film 28, the upper surface of the cobalt silicide layer 5 is lower than the upper end portions of the sidewalls 6. This prevents a short circuit in the cobalt silicide layer S and in the cobalt silicide layer 26 or the source/drain regions 10.

Eleventh Preferred Embodiment

Figure 32:
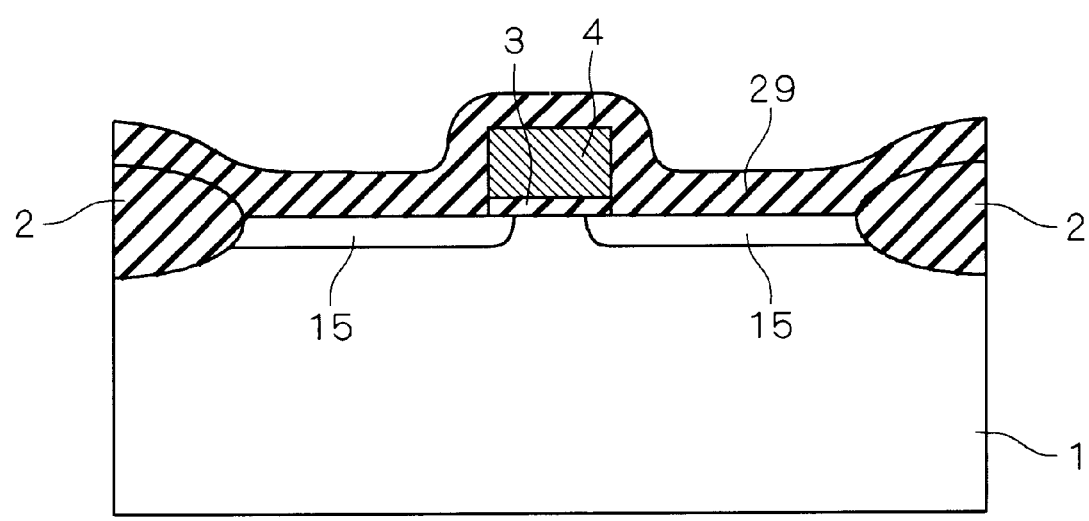
FIGS. 32 through 35 are cross-sectional views illustrating, in order of successive steps, a method of manufacturing a semiconductor device according to an eleventh preferred embodiment of the present invention.

FIGS. 32 through 35 are cross-sectional views illustrating, in order of successive steps, a method of manufacturing a semiconductor device according to an eleventh preferred embodiment of the present invention. First, a similar structure to FIG. 8 is obtained in the same way as in the fourth preferred embodiment. After the gate insulation film 3 is formed by removing the silicon oxide film 11 except that under the gate electrode 4, a silicon oxide film 29 with a thickness of 100 to 2000 Å is formed by CVD methods (FIG. 32).

Figure 33:
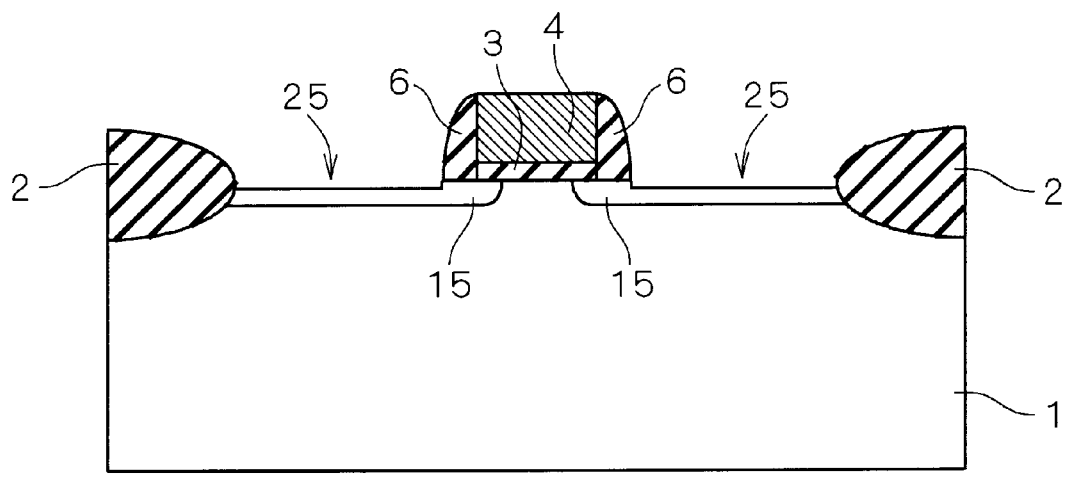

The silicon oxide film 29 is then etched back by a high etch rate of anisotropic dry etching in the depth direction of the silicon substrate 1 to thereby form the sidewalls 6 on the side faces of the gate structure. Also, the depressions 25 are formed by the anisotropic dry etching of the main surface of the silicon substrate 1 (FIG. 33).

Figure 34:
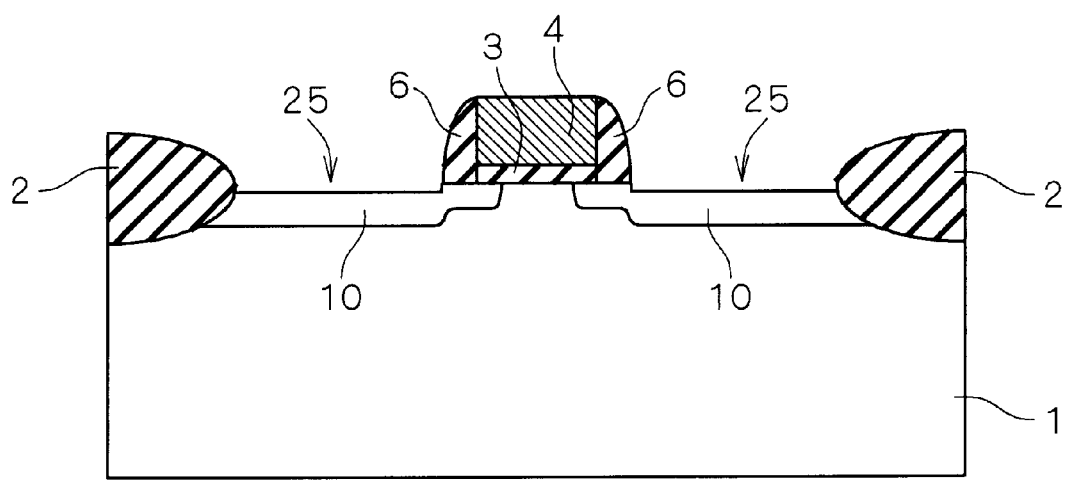
Figure 35:
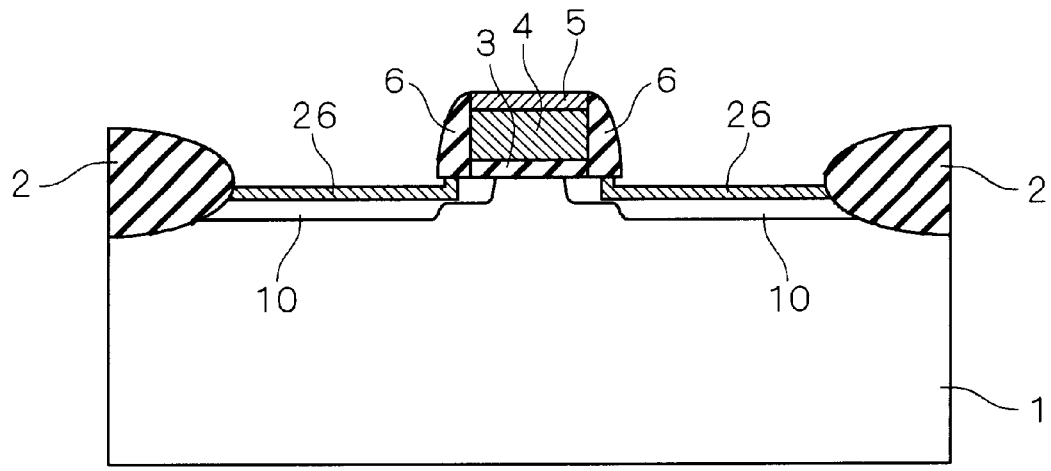

Then, heat treatment is carried out after implanting arsenic ions into the silicon substrate 1, whereby the source/drain regions 10 are formed in the main surface of the silicon substrate 1 (FIG. 34). After a cobalt film is formed over the entire surface by sputtering, the cobalt silicide layers 26 and 5 are formed by heat treatment. The unreacted cobalt film is then removed (FIG. 35).

In the method of manufacturing a semiconductor device according to the eleventh preferred embodiment before the formation of a cobalt film by sputtering, the depressions 25 are previously formed by digging in the main surface of the silicon substrate 1. This allows each of the cobalt silicide layers 26 to appropriately extend to a point under the sidewall 6 by the same reason as in the ninth preferred embodiment.

Further, the depressions 25 can be readily formed by using the anisotropic dry etching process for the formation of the sidewalls 6.

Twelfth Preferred Embodiment

Figure 36:
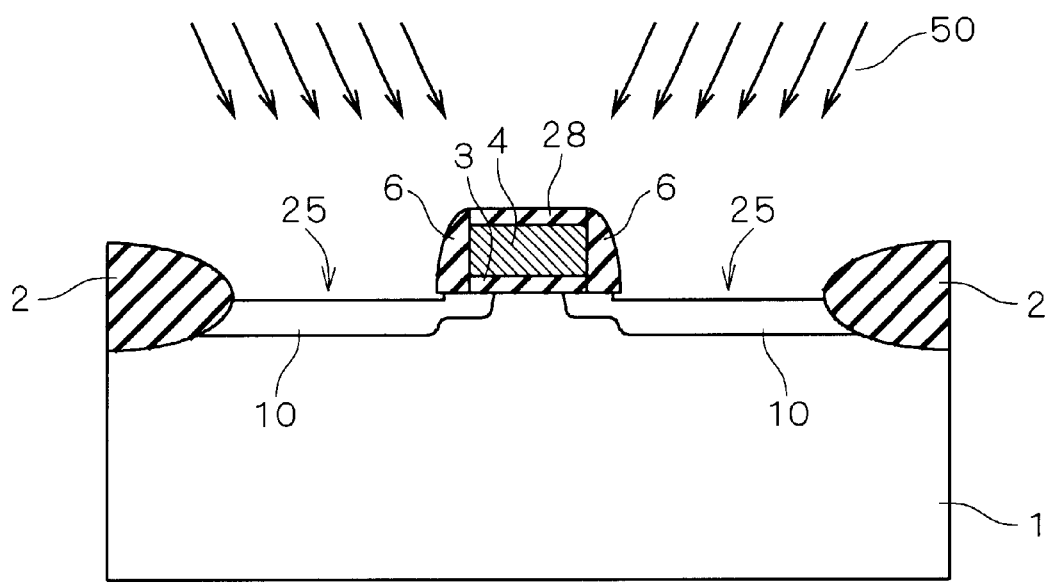
FIG. 36 is a cross-sectional view illustrating a step of a method of manufacturing a semiconductor device according to a twelfth preferred embodiment of the present invention.
Figure 37:
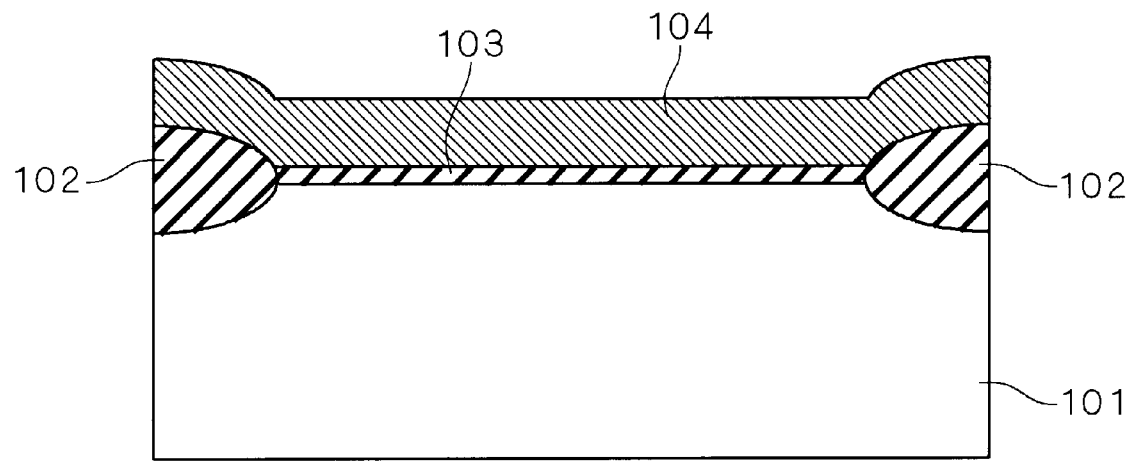
FIGS. 37 through 40 are cross-sectional views illustrating a method of manufacturing a conventional semiconductor device in order of successive steps.
Figure 38:
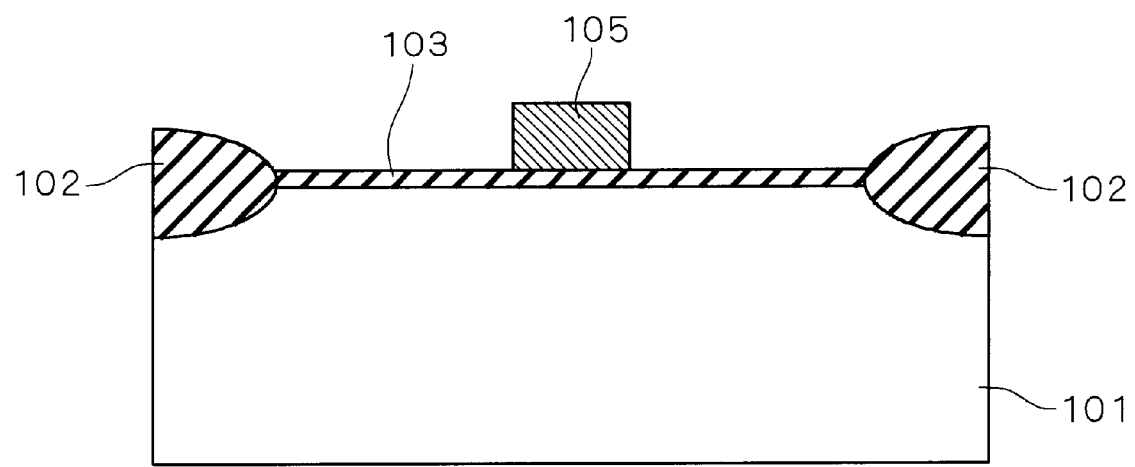
Figure 39:
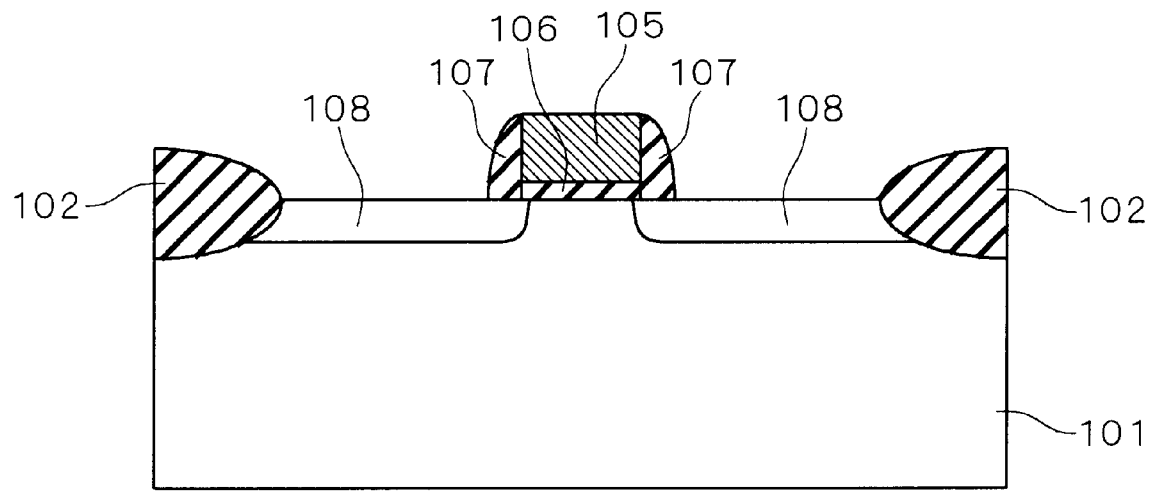
Figure 40:
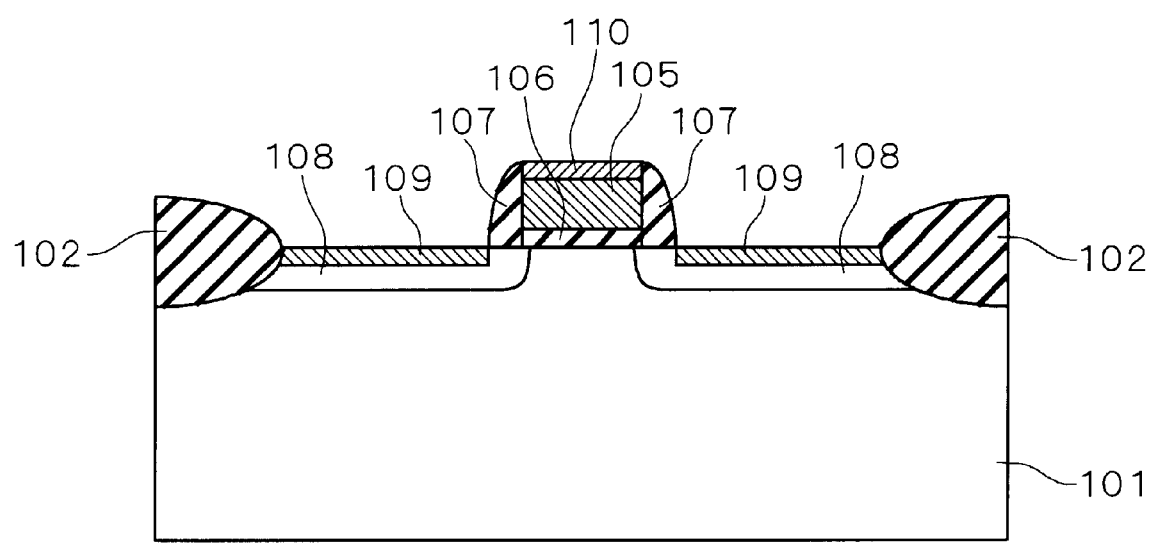

FIG. 36 is a cross-sectional view showing one step of a method of manufacturing a semiconductor device according to a twelfth preferred embodiment of the present invention. This method is based on the methods of the ninth through eleventh preferred embodiment. In the step of forming a cobalt film over the entire surface, along with the rotation of the wafer, a metallic material 50 to be the cobalt film is angularly sputtered on the surface of the depressions 25 relative to the normal to the main surface of the silicon substrate 1.

In the method of manufacturing a semiconductor device according to the twelfth preferred embodiment, the metallic material 50 can appropriately adhere to the side faces of the depressions 25. Besides, sputtering with the rotation of the wafer allows suppression of directional dependency.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the sequential steps of:
    (a) selectively forming a gate structure on a main surface of a substrate, said gate structure having a laminated structure with a gate insulation film and a gate electrode stacked in this order;
    (b) forming an amorphous region in a portion of said main surface of said substrate where a metal-semiconductor compound region is to be formed;
    (c) after said step (b), forming a metal film on said amorphous region; and
    (d) forming said metal-semiconductor compound region by performing a heat treatment to a structure obtained by said step (c) so that said amorphous region is silicided.

2. The method according to claim 1, wherein
    in said step (b), said amorphous region is formed by implanting heavy ions into said substrate with said gate structure as a mask.

3. The method according to claim 2, wherein
    in said step (b), said heavy ions are angularity implanted into said substrate with respect to a normal to said main surface of said substrate.

4. The method of according to claim 1, wherein
    said step (b) comprises the steps of:
    (b-1) forming a sidewall on a side face of said gate structure; and
    (b-2) implanting heavy ions into said substrate with said gate structure and said sidewall as masks.

5. The method according to claim 4, wherein
    in said step (b), said heavy ions are angularity implanted into said substrate with respect to a normal to s aid main surface of said substrate.

6. The method according to claim 1, further comprising the steps of:
    (d) forming a sidewall on a side face of said gate structure;
    (e) doping said substrate with impurities using said gate structure and said sidewall as masks; and
    (f) forming a source/drain region in said main surface of said substrate by thermal diffusion of said impurities in said substrate,
    wherein, in said step (b), said amorphous region is simultaneously formed by doping with said impurities in said step (e),
    wherein said step (c) is performed between said step (e) and said step (f).

7. The method according to claim 1, wherein
    in said step (b), said amorphous region is formed by forming a sidewall on a side face of said gate structure, said sidewall being made of a material that produces, with said substrate, such high stress that said substrate becomes amorphous.

8. The method according to claim 1, further comprising the step of:
    (g) after said step (a), forming a source/drain region in said main surface of said substrate by doping said substrate with impurities using said gate structure as a mask,
    wherein an end portion of said metal-semiconductor compound region on said gate structure's side is located within said source/drain region.

9. A method of manufacturing a semiconductor device, comprising the steps of:
    (a) selectively forming a gate structure on a main surface of a substrate, said gate structure having a laminated structure with a gate insulation film and a gate electrode stacked in this order;
    (b) forming a sidewall on a side face of said gate structure;
    (c) forming a depression by digging in a portion of said main surface of said substrate where said gate structure and said sidewall are not formed; and
    (d) forming a metal-semiconductor compound region by silicidation of said substrate from a surface of said depression.

10. The method according to claim 9, wherein
    in said step (c), said depression is formed by isotropic etching of said substrate.

11. The method according to claim 9, wherein
    said step (b) comprises the steps of:
    (b-1) forming an insulation film on a structure obtained by said step (a); and
    (b-2) etching said insulation film by a high etch rate of anisotropic etching in a depth direction of said substrate,
    wherein, in said step (c), said depression is formed by said anisotropic etching.

12. The method according to claim 9, wherein
said step (d) comprises the steps of:
- (d-1) forming a metal film on a surface of said depression by sputtering of a metallic material; and
- (d-2) inducing a reaction between said metal film and said substrate by heat treatment to form said metal-semiconductor compound region,
- wherein, in said step (d-1), said metallic material is angularity sputtered on the surface of said depression with respect to a normal to said main surface of said substrate.

13. The method according to claim 9, further comprising:
- (e) digging in an upper surface of said gate electrode to a predetermined depth; and
- (f) after said step (e), forming a metal-semiconductor compound layer by silicidation of a resultant upper surface of said gate electrode.

14. The method according to claim 9, wherein
said gate structure formed in said step (a) has a laminated structure with said insulation film, said gate electrode, and a mask insulation film stacked in this order,
said method further comprising the steps of:
- (e) after said step (b), removing said mask insulation film; and
- (f) forming a metal-semiconductor compound layer by silicidation of an upper surface of said gate electrode exposed by the removal of said mask insulation film.

15. The method according to claim 9, further comprising the step of:
- (g) after said step (a), forming a source/drain region in said main surface of said substrate by doping said substrate with impurities using said gate structure as a mask,
- wherein an end portion of said metal-semiconductor compound region on said gate structure's side is located within said source/drain region.

* * * * *